(12) United States Patent
Lopez et al.

(10) Patent No.: US 8,212,631 B2
(45) Date of Patent: Jul. 3, 2012

(54) MULTI-LEVEL POWER AMPLIFICATION SYSTEM

(75) Inventors: Noel Lopez, Phoenix, AZ (US); Charles Woods, Gilbert, AZ (US); Rob Zienkewicz, Chandler, AZ (US); Jon Filreis, Mesa, AZ (US)

(73) Assignee: ViaSat, Inc., Carlsbad, CA (US)

( * ) Notice: Subject to any disclaimer, the term of this patent is extended or adjusted under 35 U.S.C. 154(b) by 449 days.

(21) Appl. No.: 12/403,292

(22) Filed: Mar. 12, 2009

(65) Prior Publication Data

US 2009/0231055 A1      Sep. 17, 2009

Related U.S. Application Data

(60) Provisional application No. 61/036,417, filed on Mar. 13, 2008.

(51) Int. Cl.
   *H01P 5/12* (2006.01)
(52) U.S. Cl. .................................... 333/125; 333/136
(58) Field of Classification Search .......... 333/124–129, 333/132, 134, 136; 330/124 R, 286, 295
See application file for complete search history.

(56) References Cited

U.S. PATENT DOCUMENTS

| | | |
|---|---|---|
| 3,987,451 A | 10/1976 | Peterson |
| 4,608,713 A | 8/1986 | Shiomi et al. |
| 4,868,639 A | 9/1989 | Mugiya et al. |
| 4,947,111 A | 8/1990 | Higman |
| 4,967,168 A | 10/1990 | Bacher et al. |
| 5,019,829 A | 5/1991 | Heckman |
| 5,045,820 A | 9/1991 | Leicht et al. |
| 5,170,142 A | 12/1992 | Bier |
| 5,198,786 A | 3/1993 | Russell et al. |
| 5,218,322 A * | 6/1993 | Allison et al. ............... 330/286 |
| 5,218,373 A | 6/1993 | Heckaman et al. |
| 5,361,049 A | 11/1994 | Rubin et al. |
| 5,376,901 A | 12/1994 | Chan |
| 5,468,380 A | 11/1995 | Yabuuchi |
| 5,488,380 A | 1/1996 | Harvey et al. |

(Continued)

FOREIGN PATENT DOCUMENTS

DE          3127693 A1       5/1983

(Continued)

OTHER PUBLICATIONS

Office Action dated Nov. 24, 2008 for U.S. Appl. No. 11/853,287.

(Continued)

*Primary Examiner* — Robert Pascal
*Assistant Examiner* — Kimberly Glenn
(74) *Attorney, Agent, or Firm* — Snell & Wilmer, LLP

(57) ABSTRACT

In general, in accordance with an exemplary aspect of the present invention, an electrical system configured to use power combining of microwave signals, such as those from monolithic microwave integrated circuits or MMICs is provided. In one exemplary embodiment, the system of the present invention further comprises a low loss interface that the circuits are directly connected to. In another exemplary embodiment, the circuits are connected to a pin which is connected to the low loss interface. In yet another exemplary embodiment of the present invention, a multi-layer power amplifier is provided that comprises two or more chassis and circuits attached to impedance matching interfaces according to the present invention. This multi-layered power amplifier is configured to amplify an energy signal and have a significantly reduced volume compared to existing power combiners.

9 Claims, 17 Drawing Sheets

U.S. PATENT DOCUMENTS

| | | | |
|---|---|---|---|
| 5,678,210 | A | 10/1997 | Hannah |
| 5,945,894 | A | 8/1999 | Ishikawa et al. |
| 5,969,580 | A | 10/1999 | Maillet et al. |
| 6,232,849 | B1 | 5/2001 | Flynn et al. |
| 6,265,580 | B1 | 7/2001 | Matsuda |
| 6,265,590 | B1 | 7/2001 | Samukov |
| 6,265,950 | B1 | 7/2001 | Schmidt et al. |
| 6,363,605 | B1 | 4/2002 | Shih et al. |
| 6,803,837 | B2 | 10/2004 | Ishida |
| 6,911,877 | B2 | 6/2005 | Bickford |
| 7,068,121 | B2 | 6/2006 | Ding et al. |
| 7,486,157 | B2 | 2/2009 | Takagi |
| 2004/0038587 | A1 | 2/2004 | Yeung et al. |
| 2005/0191869 | A1 | 9/2005 | Oldfield |
| 2007/0096805 | A1 | 5/2007 | Kim et al. |

FOREIGN PATENT DOCUMENTS

| | | |
|---|---|---|
| DE | 19636890 C1 | 2/1998 |
| EP | 0954045 | 11/1999 |
| EP | 0954045 | 5/2001 |
| EP | 1494309 A1 | 5/2005 |
| EP | 1744395 | 1/2007 |
| JP | 06-338709 | 6/1994 |
| JP | 254223 | 9/2004 |
| JP | 039414 | 2/2005 |
| WO | 02/071533 A1 | 9/2002 |
| WO | WO 03/084001 | 10/2003 |

OTHER PUBLICATIONS

First Written Opinion of International PCT Application No. PCT/US2008/075969 dated Nov. 18, 2008.
Office Action dated Jan. 5, 2009 for U.S. Appl. No. 11/874,369.
Preliminary Amendment and Response to Election of Species Requirement dated Dec. 18, 2008 for U.S. Appl. No. 11/853,287.
Amendment and Response to Office Action dated Mar. 6, 2009 for U.S. Appl. No. 11/874,369.
European Examination Report dated Mar. 3, 2011 Application No. 08 747 243.7-1248.
Nonfinal Office Action dated Dec. 12, 2008 for U.S. Appl. No. 11/743,496.
Nonfinal Office Action dated Mar. 2, 2010 for U.S. Appl. No. 11/853,287.
International Preliminary Report on Patentability dated Mar. 16, 2010 for International Patent Application No. PCT/US2008/075969.
Notice of Allowance dated Apr. 6, 2009 for U.S. Appl. No. 11/743,496.
Nonfinal Office Action dated Apr. 16, 2010 for U.S. Appl. No. 11/874,369.
Final Office Action dated Apr. 19, 2010 for U.S. Appl. No. 12/039,529.
Office Action dated Apr. 15, 2009 for U.S. Appl. No. 11/853,287.
Notice of Allowance for U.S. Appl. No. 11/853,287 dated Jun. 16, 2010.
Notice of Allowance for U.S. Appl. No. 12/039,529 dated Jul. 22, 2010.
Notice of Allowance for U.S. Appl. No. 11/874,369 dated Aug. 12, 2010.
PCT/US2009/037023 International Preliminary Report on Patentability Sep. 14, 2010.
The Int'l Search Report and Written Opinion from corresponding Int'l Application No. PCT/US09/37023 dated Oct. 12, 2009.
Final Office Action dated Jun. 19, 2009 in U.S. Appl. No. 11/874,369.
Notice of Allowance for U.S. Appl. No. 11/743,496 dated Oct. 1, 2009.
Office Action for U.S. Appl. No. 11/853,287 dated Nov. 12, 2009.
International Search Report for International Application No. PCT/KR03/00597 dated Jul. 9, 2003.
International Preliminary Report on Patentability for International Application No. PCT/US2008/062095 dated May 20, 2009.
Office Action for U.S. Appl. No. 11/874,369 dated Nov. 18, 2009.
Office Action for U.S. Appl. No. 11/874,369 dated Jun. 19, 2009.
Office Action for U.S. Appl. No. 11/874,369 dated Jan. 5, 2009.
International Search Report and Written Opinion from related PCT application (PCT/US2008/06205) dated Aug. 8, 2008.
First Written Opinion of International PCT Application No. PCT/US2009/037023 dated Oct. 12, 2009.
Office Action for U.S. Appl. No. 12/039,529 dated Nov. 27, 2009.
A Novel Waveguide-To-Microstrip Transition for Millimeter-Wave Applications dated Mar. 1, 2004 by Li J et al.
European Search Report dated Feb. 16, 2012 for PCT/US2008075969.

* cited by examiner

MULTI-LEVEL POWER AMPLIFICATION SYSTEM

CROSS-REFERENCE TO RELATED APPLICATION

This Application claims priority to and the benefit of U.S. Provisional Patent Application No. 61/036,417 filed Mar. 13, 2008 entitled "Low Loss Integrated Circuit System with Numerous Power Circuits," wherein such provisional application is hereby incorporated in its entirety.

FIELD OF INVENTION

The present invention generally relates to a multi-level system with multiple circuits. More particularly, the present invention relates to an electrical system with two or more circuits, a power splitter, and a power combiner that are located on multiple levels.

BACKGROUND OF THE INVENTION

There are numerous circuits and other electronic devices that produce energy waves, such as electromagnetic waves and microwaves. These circuits produce energy waves that are delivered to a destination through different wires, guides, and other mediums. Certain exemplary circuits comprise integrated circuits such as a monolithic microwave integrated circuit ("MMIC").

MMICs are used in various electrical systems to up convert, down convert, and/or amplify electromagnetic ("EM") and/or radio frequency ("RF") signals among other functions. In certain situations, the amount of EM power desired for a particular electrical system is greater than a single MMIC or other circuit can provide or withstand. In yet other situations a high power MMIC may be excessively expensive. In these situations, two or more MMIC's (or other circuits) may be used in parallel to achieve a desired output.

Electrical systems that include more than one circuit have various disadvantages. This is particularly the case when the electrical system also contains numerous other components where the impedance experienced by the energy at the MMIC must closely match the impedance the energy will experience at other components (such as a waveguide) to reduce energy loss. One exemplary electrical system where this is especially problematic is a system that comprises an integrated circuit such as a MMIC transitioning to a waveguide.

Electrical systems comprising two or more MMICs connected to a waveguide typically include a power combiner to combine the power from multiple MMICs before delivering it to the waveguide. Power combiners, such as a waveguide combiner tend to be complicated, heavy, and expensive and thus they are cost prohibitive. Further, power combiners increase the size of electrical systems to the point where the system itself is too big for many applications. Other known systems use a technique known as power splitting, with similar size and cost issues.

Certain systems, devices, and methods exist that combine the power produced by multiple MMICs without the use of separate power combiners. These devices include coaxial devices and cables, amplifiers such as a Grid Amplifier® produced by the Wavestream Corporation of San Dimas, Calif., and other spatial combining devices. While effective, these devices still tend to have unacceptable amounts of energy loss and are not thermally efficient. Energy loss is particularly problematic at higher frequencies. In certain applications, even signal losses that reduce the signal small amounts, such as 1/10 of a decibel, may result in a significant performance loss. One exemplary application where loss from energy waves such as microwaves is problematic is a power amplifier.

Another problem with known power splitters/combiners and other similar systems is the physical space that these systems occupy. Most power combiners comprise several different circuits, amplifiers, waveguides, and other related devices that require known power combiners to have a large "footprint" and occupy a large amount of space. This is disadvantageous because many applications that require a power combiner have little room for large devices. This is particularly an issue when the total weight of an electrical system containing the power combiner needs to be as minimal as possible, such as is the case when the electrical system is part of a satellite or a mobile application.

Therefore, it would be advantageous to provide an electrical system that is compact and cost effective with two or more MMICs or other integrated circuits. It would also be advantageous to provide a system that combined the power from two or more integrated circuits and that had minimal signal loss when the circuit was connected to another structure such as a waveguide. It would also be advantageous to provide a system with two or more integrated circuits that was thermally efficient.

SUMMARY OF THE INVENTION

In general, in accordance with one exemplary embodiment of the present invention, an electrical system comprising two or more circuits is provided. In one exemplary embodiment, the circuits are integrated circuits such as MMICs and are connected to a waveguide or other energy transition device by an impedance matching interface. In other exemplary embodiments, the system comprises a two or more circuits that are directly connected to an interface with a wirebond. In yet other exemplary embodiments, the system comprises two or more circuits that are connected to an interface with a nail or pin. In yet another exemplary embodiment, the system comprises a multi-level power amplifier with two or more chassis wherein each chassis defines a different level with a different function and wherein each chassis is in a separate, parallel plane.

BRIEF DESCRIPTION OF THE DRAWING

A more complete understanding of the present invention may be derived by referring to the detailed description and claims when considered in connection with the Figures, where like reference numbers refer to similar elements throughout the Figures, and:

DETAILED DESCRIPTION OF EXEMPLARY
EMBODIMENTS OF THE INVENTION

In accordance with one aspect of the present invention, an electrical system with two or more devices configured to provide and/or amplify power is disclosed. Throughout, the electrical system will be referred to as system 10.

With reference to FIGS. 1-17 and in accordance with one exemplary embodiment, system 10 comprises two or more circuits 12, an interface 14, and an energy transmission device 16. It should be noted that circuits 12, interface 14, and energy transmission device 16 can be those described in co-pending patent application Ser. No. 12/039,529 filed on Feb. 28, 2008 and entitled "Adjustable Low Loss Interface" or co-pending patent application Ser. No. 11/853,287 filed on Sep. 11, 2007 entitled "Low-Loss Interface." Both of these applications are incorporated in their entirety by reference.

Figure 1:
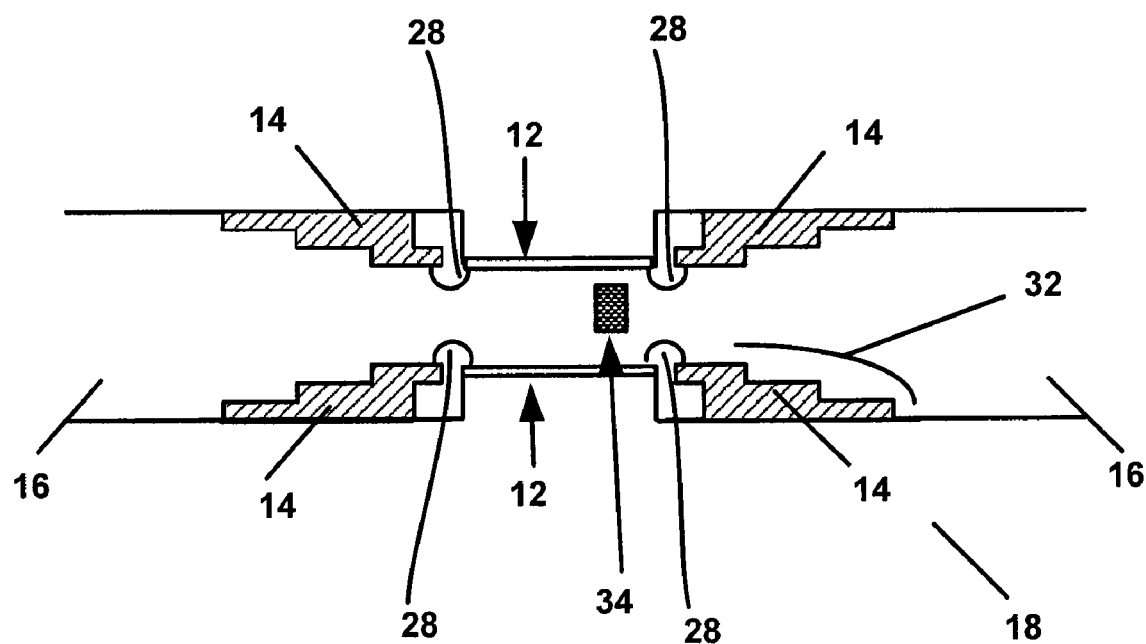
FIG. 1 illustrates a cross-sectional view of an electrical system with two circuits directly connected to waveguide cavities in accordance with one exemplary embodiment of the present invention.
Figure 3:
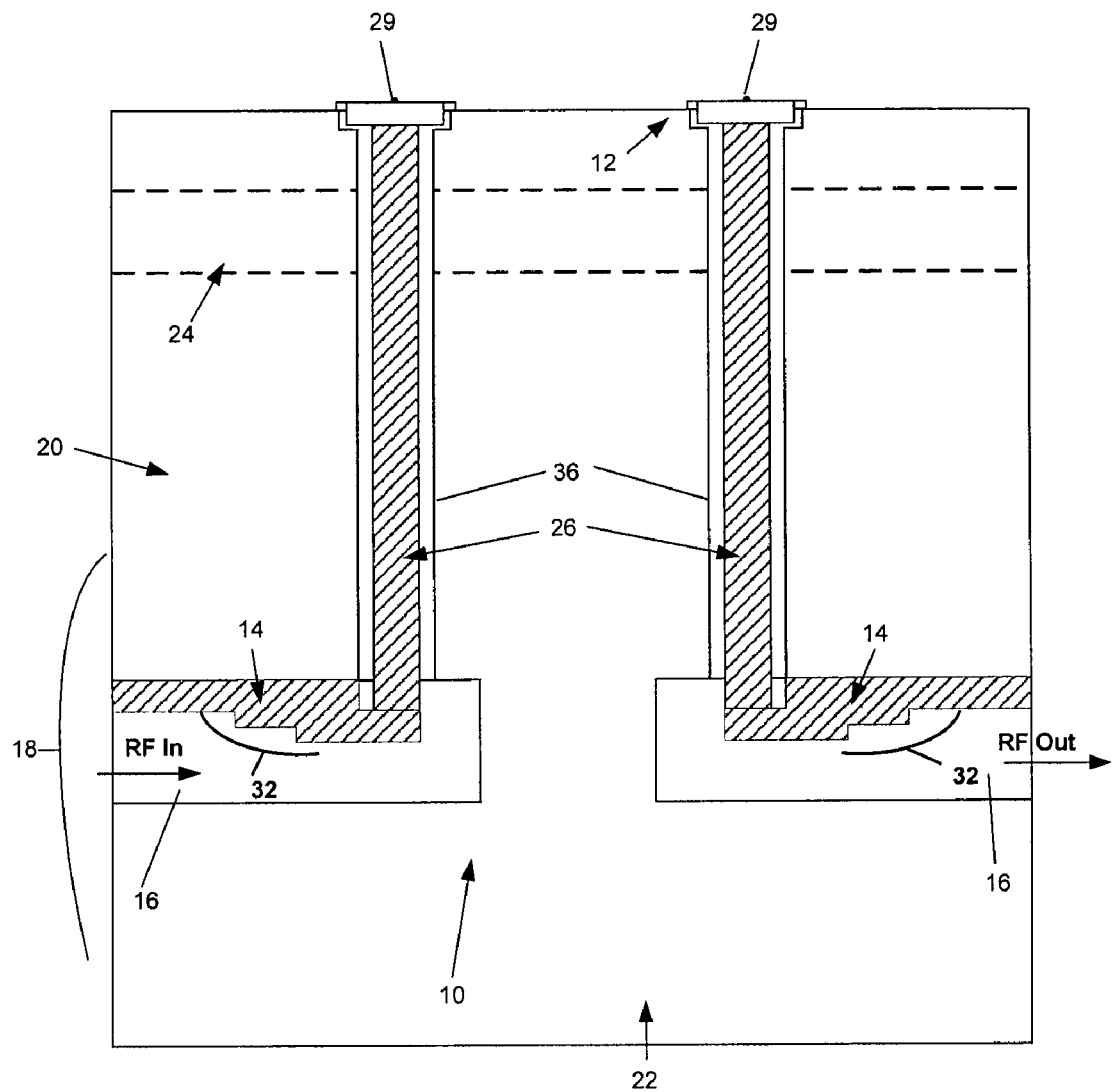
FIG. 3 illustrates a cross-sectional view of the electrical system shown in FIG. 2 in accordance with one exemplary embodiment of the present invention.

With particular reference to FIGS. 1 and 3, interface 14, circuits 12, and energy transmission device 16 are typically located within another structure 18 (such as a chassis as describe below) that surrounds the various components that comprise system 10. Structure 18 may comprise a lid 20 and a base 22 or structure 18 can be a single unit with space for circuits 12, interface 14, and energy transmission device 16. In certain exemplary embodiments, structure 18 is constructed from metal such as aluminum or copper. In other exemplary embodiments, structure 18 is plated with another metal such as gold or silver.

In one exemplary embodiment, circuits 12 are integrated circuits such as MMICs. In another exemplary embodiment, circuits 12 comprises discrete components on a circuit board such as power amplifiers, low noise amplifiers, detectors, limiters, isolators, switches, filters, multiplexers, couplers, and the like. Circuits 12 can be any type of circuit, circuit board, printed circuit board, integrated circuit such as a MMIC, discrete component, combination of discrete components, or other type of device or medium that produces, receives, or transfers electronic waves such as microwave signals. In one exemplary embodiment, the circuit is a MMIC or other electrical device attached to or otherwise in communication with a microstrip. As such, the terms "circuit" or "integrated circuit" are not limited to devices with discrete components on a circuit board, but rather includes any device that passes energy waves such as antennas, wires, cables, or waveguides.

Circuits 12 can be attached directly to structure 18 which assists in improving heat transfer from circuits 12. In one exemplary embodiment, heat transfer from circuits 12 is improved because structure 18 is constructed of metal which conducts heat produced by circuits 12 away from system 10. Further, structure 18 may further comprise one or more heat pipes 24 which assist in efficiently moving large amounts of heat produced by circuits 12. In other exemplary embodiments, heat pipes 24 are not utilized.

In one exemplary embodiment, circuit 12 is not disposed within a waveguide cavity. Therefore, circuit 12 is not constrained by the physical size or dimensions of the waveguide cavity. Thus, a larger, more powerful circuit 12 may be used.

In one exemplary embodiment, heat pipes 24 are disposed within structure 18 adjacent to circuits 12 and comprise metal straws or other similar structures filled with phase change fluid. Certain exemplary heat pipes 24 are two to three millimeters in thickness. In other exemplary embodiments, heat pipes 24 are hollowed out portions of structure 18. Besides phase change fluid, other fluids such as air, water, coolants, or other similar fluids can be used with heat pipes 24. In fact, any device disposed within or comprised of structure 18 that is configured to conduct heat away from circuits 12 can function as heat pipes 24 and fall within the scope of the present invention.

Figure 2:
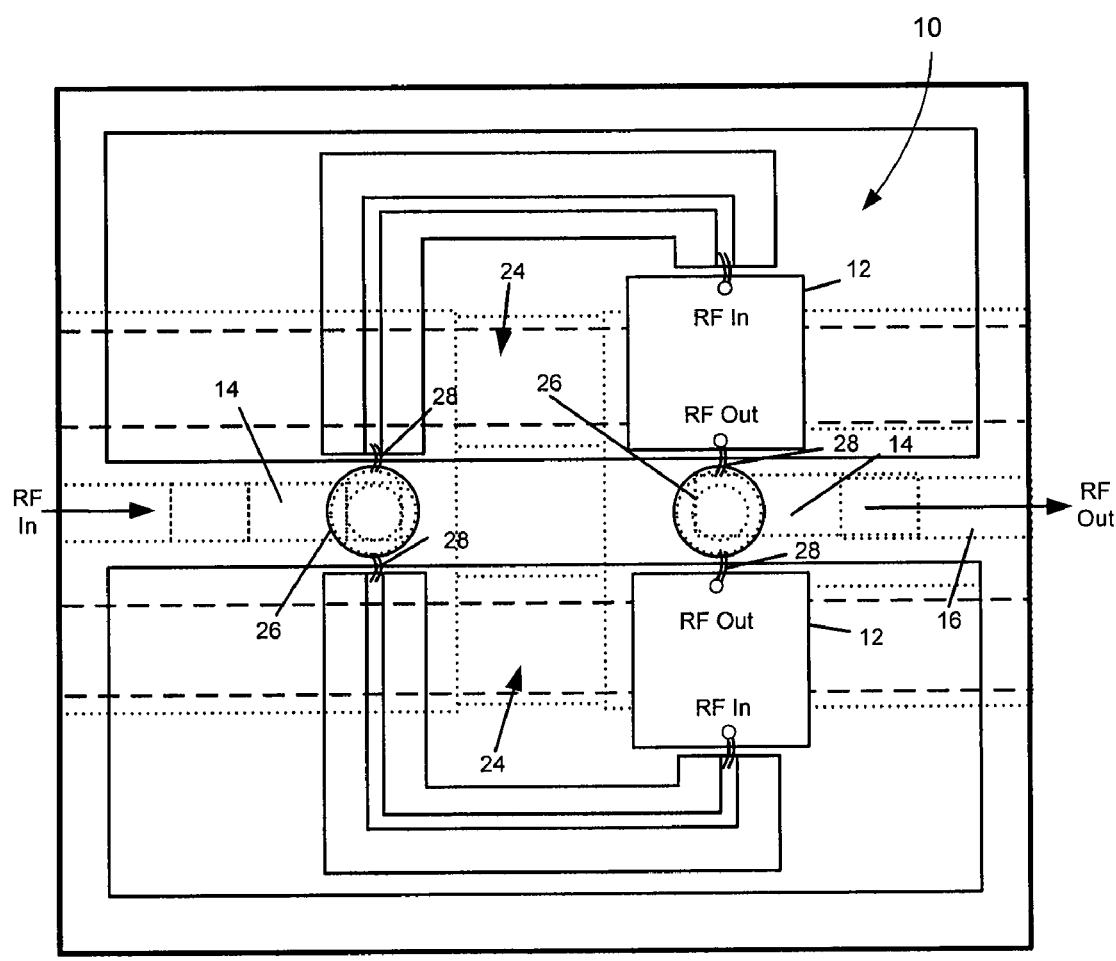
FIG. 2 illustrates a top view of an electrical system with two circuits directly connected to a pin(s) in accordance with one exemplary embodiment of the present invention.

In an exemplary embodiment, and with reference to FIGS. 1 and 2, circuits 12 are directly connected to interface 14. In another exemplary embodiment, circuits 12 are directly connected to another structure such as a pin 26 (described below). These connections may be made with a wirebond 28. Wirebond 28 further connects circuits 12 to various other structures. For example, in exemplary embodiments depicted in FIGS. 1 and 5, wirebond 28 directly connects circuits 12 to an input device such as a microstrip 30. In other exemplary embodiments, wirebond 28 connects circuits 12 to various other structures such as another interface 14 as disclosed in co-pending application Ser. No. 12/039,529 entitled "Adjustable Low-Loss Interface" noted above. In yet other exemplary embodiments, circuit 12 is not directly connected by wirebond 28 to interface 14. Rather, circuit 12 is connected to a microstrip, then wirebond 28, and then connected to interface 14.

Wirebond 28 may comprise an electrically conductive low-loss material and wirebond 28 may further comprise leads, pins, ribbons or anything else that connects two circuits 12 that transmit energy. As used throughout this specification, the term "energy" is meant to include, but not necessarily be limited to radio frequency energy, EM energy, microwave energy, and/or other energy forms. Certain exemplary wirebond materials include, but are not limited to, gold, silver, copper, various alloys, beryllium, copper, tungsten, and/or other similar materials with high conductivity and low resistance.

Furthermore, any device or piece of material configured to transport energy can be used as wirebond 28. Certain exemplary wirebonds 28 are 0.15 millimeters to 2.5 millimeters in length. Wirebond 28 can be any size suitable for the particular location that system 10 is used for. Further, in certain other exemplary embodiments, wirebond 28 can be a probe, a coaxial pin, cable or another type of device with a coaxial configuration. In other exemplary embodiments, wirebond 28 is a spongy material such as disclosed in the co-pending patent application noted above entitled Low-Loss Interface.

Interface 14 is configured to connect any energy transmission, reception, or similar device to energy transmission device 16 or any other device configured to transport energy and fall within the scope of the present invention. While not mandatory, interface 14 can be used within system 10 to reduce loss as explained herein. In one exemplary embodiment, interface 14 is a step launch. The step launch may comprise a stepped transition defining an interface cavity that increases in volume up to the volume of a waveguide cavity. In an exemplary embodiment, the stepped transition defines a series of ridges or steps 32 (see FIGS. 1 and 3) along an interface cavity which leads into the waveguide cavity. In one exemplary embodiment, the step launch is configured such that steps 32 are larger in the direction from the interface cavity to the waveguide cavity. In another exemplary embodiment, the depth and/or height of each step may be the same from step to step so that each step may resemble the step before it. In one exemplary embodiment, the height of each step is 0.5 millimeters at Ka band frequencies. At lower frequencies, the height of each step can be more significant; for example, a height of 3 millimeters. In other embodiments, however, the depth and/or height of each step may vary compared to one or more other steps in the step launch. Moreover, the corner or edges of steps 32 may be rounded to approximately a radius of 0.001 millimeters to 1 millimeter in one exemplary embodiment to further reduce loss.

The step launch or other interface 14 can be constructed from any conductive material that minimizes loss. In an exemplary embodiment, interface 14 is gold plated. In other exemplary embodiments, interface 14 is comprised of silver, copper, aluminum, plated plastics, plated ceramics, various metals and/or alloys, and/or other similar materials with low resistance. Any materials configured to facilitate impedance matching and reduce signal loss can be used to construct interface 14.

The step launch is configured to provide a stepped transition from the impedance the energy experiences at circuits 12 to the impedance the energy experiences at energy transmission device 16. The number of steps 32 is typically related to the size of the cavity defined by energy transmission device 16 in that the larger the cavity, the greater number of steps 32 may be used to match the output impedance of circuits 12 to the input impedance of energy transmission device 16 such as waveguide. It should also be noted that the steps' length and height can be selected to reduce loss depending on the application that interface 14 is used for. For example, the second ridge or step of the step launch can be built to be longer than the first ridge as shown. In this embodiment, the insertion loss has been shown to be less than 0.2 dB from 27 GHz to 38.6 GHz. In other embodiments, adjusting the various dimensions of the ridges or steps has reduced insertion loss to less than 0.1 dB based on an energy frequency increase from 27 GHz to 38.4 GHz.

The number of steps may be a function of room available for transition and manufacturability of steps. Specifically, a smaller cavity may have less step features than a larger cavity. According to an exemplary embodiment of the present invention, any number of ridges, steps, or other similar features can be used and fall within the scope of the present invention. In certain exemplary embodiments, the size of the steps is a function of frequency. Therefore, the steps may be smaller at higher frequencies and larger at lower frequencies. In yet other exemplary embodiments, interface 14 can comprise a smooth, slopped transition without steps. The angle of the transition can be whatever angle is needed to facilitate impedance matching between circuit 12 and energy transmission device 16. Certain exemplary stepped transitions for various step launches include, but are not limited to, triangular, exponential, or Klopfenstein tapers.

System 10 further comprises energy transmission device 16. In one exemplary embodiment, energy transmission device 16 is a waveguide that transports microwave energy waves. Certain examples of waveguides may be circular waveguides, rectangular waveguides, and parallel plate waveguides. However, in other exemplary embodiments, energy transmission device 16 can be any type of device or medium configured to transport energy such as feed horns, antennas, or other devices configured to transport and guide energy waves from one source to another.

With reference again to FIG. 1 and according to one exemplary embodiment of the present invention, system 10 may further comprise an isolation wall 34 as described in co-pending patent application Ser. No. 12/039,529 entitled "Adjustable Low-Loss Interface." Isolation wall 34 is located between the input and output regions of one or more of circuits 12. Isolation wall 34 is any structure that separates the input and output region and is configured to reduce ripple and other interference between the input and output regions to reduce loss. An exemplary isolation wall 34 comprises metal structures, microwave absorbers, and/or dielectrics that reduce ripple. Reducing the ripple at this location also reduces the overall loss of power in the energy waves at the transition between circuits 12 and energy transmission device 16.

Further, isolation wall 34 isolates the input and output pads (i.e. the input and output region) present on circuits 12 such as a MMIC. Isolating the input and output regions of a MMIC reduces the chances that oscillation will occur at the MMIC or other circuits 12.

Maintaining this isolation is important because numerous undesirable effects arise when the proper isolation is not present. For example, the oscillation experienced by certain circuits such as a MMIC is problematic. Further, the interactions between the input and output regions leads to excess ripple which in turn reduces performance and leads to less output power and more gain variation. These problems are all magnified when working with energy at higher frequencies. Therefore, isolation wall 34 prevents loss at high frequencies and increases performance.

Isolation wall 34 can be constructed from the same material as structure 18 such as aluminum or copper or it can be constructed of another material and, for example, plated with silver or gold. In this exemplary embodiment, isolation wall 34 is approximately one millimeter thick. In other exemplary embodiments, isolation wall 34 is approximately 0.25 to fifty millimeters thick. In various exemplary embodiments, isolation wall 34 is approximately 1 millimeter to 50 millimeters wide. In one exemplary embodiment, isolation wall 34 is 5 millimeters wide at Ka band. Any size or shape of isolation wall 34 that is configured to reduce ripple by isolating input region from the output region falls within the scope of the present invention. Further, isolation wall 34 can be a simply a vertical member depicted in FIG. 1 or it can have a flange or other similar horizontal member.

In certain exemplary embodiments, isolation wall 34 is placed at a distance of approximately 0.5 to 0.05 millimeters away from one or more of circuits 12. In other exemplary embodiments, isolation wall is placed at a distance in the range of 0.25 millimeters away from circuits 12 or anywhere in a range of approximately 0.25 to 0.5 millimeters away from circuits 12. In yet other exemplary embodiments, other distance ranges can be used and fall within the scope of the present invention. Further, in an exemplary embodiment when MMICs are used as integrated circuits 12, isolation wall 34 may be placed immediately after the last gain stages on the MMICs and the output wirebond. However, isolation wall 34 can be placed at any location along in system 10 and fall within the scope of the present invention.

System 10 enables numerous circuits 12 to be combined into a single system 10. There are various different configurations and methods of combining circuits 12 and a few, non-limiting examples will be discussed herein. For example, as depicted in the exemplary embodiment shown in FIG. 1, two circuits 12 are used in system 10. In this embodiment, one circuit 12 is disposed on lid 20 and another circuit 12 is disposed on base 22. It should also be noted that although referred to herein as a lid and a base, such structures may be any two physical components functioning together to form a single structure as described herein. Each circuit is connected by wirebond 28 to an input source (such as a microstrip or waveguide interface) and connected by another wirebond 28 to interface 14. An isolation wall 34 is attached to a lateral side of structure 18.

In certain exemplary embodiments, energy from each circuit 12 combines spatially and it is in phase as it transitions from circuit 12 to energy transmission device 16. In one exemplary embodiment, a phase match of twenty degrees or less is desired to keep phase balance losses below a tenth of a decibel.

As depicted in FIG. 1, in one exemplary embodiment interfaces 14 are symmetric on the lid 20 and base 22. This symmetry may be desirable when circuits 12 are the same device. For example, each circuit 12 could be a 4 watt high power amplifier. Each such high power amplifier contributes half of the energy outputted from energy transmission device 16. Therefore, 8 watts of energy would be outputted. In other exemplary embodiments, lid 20 and base 22 are not symmetric and contain different circuits 12. For example, lid 20 might have a two watt high power amplifier and base 22 might have a four watt high power amplifier. In yet another exemplary embodiment, a two watt circuit 12 may be present on lid 20 while the circuit 12 on base 22 is a power detector, or another electrical device.

In another exemplary embodiment not shown, two additional circuits 12 could be used in system 10 as depicted in FIG. 1. If four circuits 12 are used, two additional circuits 12 are placed on the right and left lateral side of structure 18 between circuit 12 located on lid 20 and circuit 12 located on base 22.

With reference now to FIGS. 2 and 3 and in accordance with another exemplary embodiment, two circuits 12 can be connected to pin 26 by wirebond 28. Pin 26 in turn is then connected to interface 14. Pin 26 is any device configured to transport electrical energy from circuits 12 to another destination such as interface 14. In one exemplary embodiment, pin 26 has a coaxial structure with a center conductor and an outer conductor. Pin 26 can be constructed from any electrically conductive material. In certain exemplary embodiments, pin 26 is constructed from the same material as interface 14 and is gold plated. In other exemplary embodiments, pin 26 is comprised of silver, copper, aluminum, plated plastics, plated ceramics, various metals and/or alloys, and/or other similar materials with low resistance.

Figure 4:
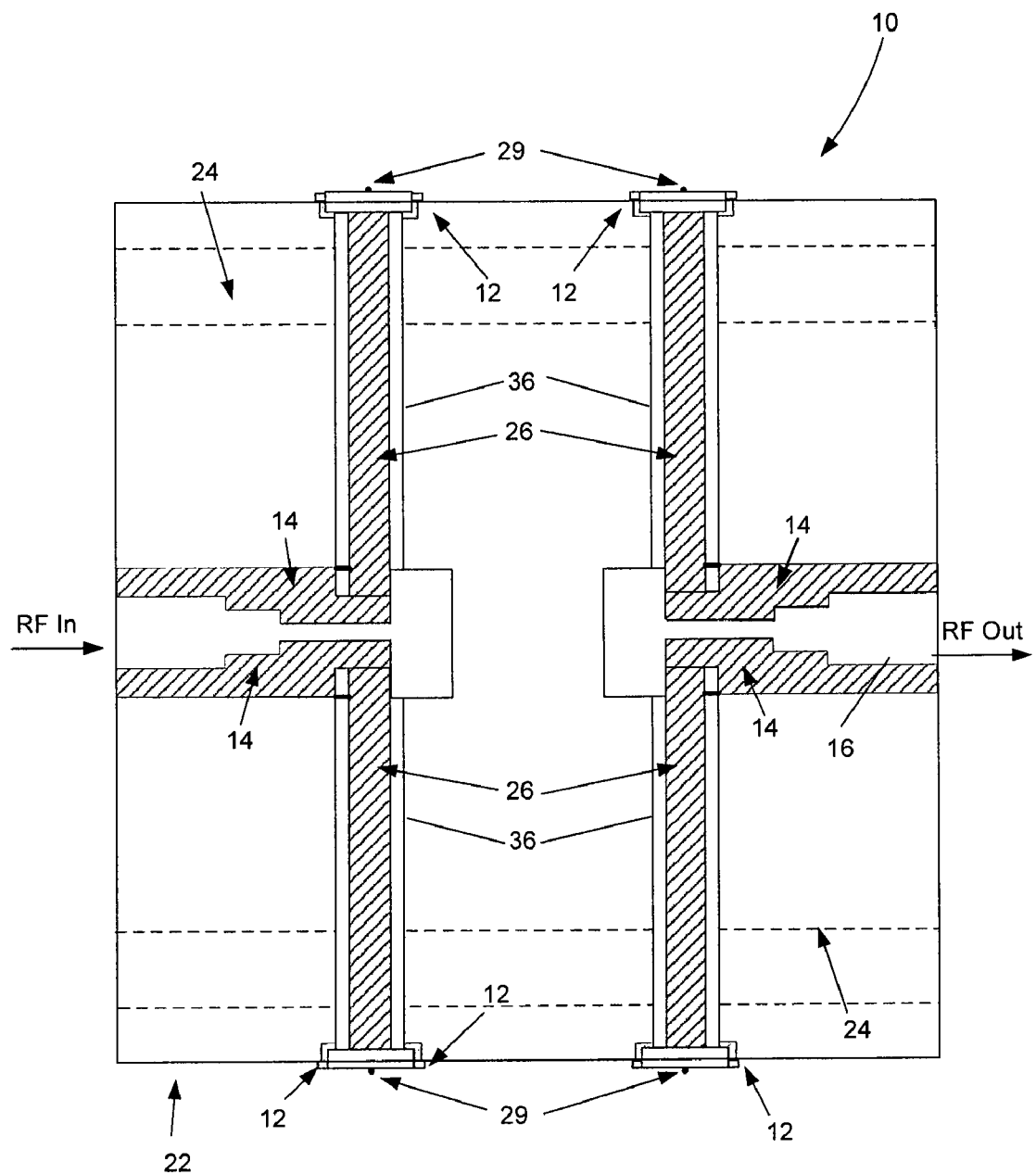
FIG. 4 illustrates a cross-sectional view of an electrical system with four circuits directly connected to a pin(s) in accordance with one exemplary embodiment of the present invention.

With particular reference to FIGS. 3 and 4 and according to one exemplary embodiment of the present invention, pin 26 is seated or disposed within structure 18 and surrounded by an air channel 36. In other exemplary embodiments, air is not used in air channel 36 and another dielectric is used. Certain exemplary dielectrics comprise glass, quartz, foam, or a product such as Teflon® produced by the E. I. DuPont DeNemours and Company of Wilmington, Del. or other to increase mechanical stability. In one exemplary embodiment, pin 26 further comprises a flange member to secure it to lid 20 or base 22. As shown in FIG. 3, one pin 26 is connected to interface 14 that serves as in input region for energy such as RF energy while another pin 26 is connected to another interface 14 that serves an output region for EM energy. In this exemplary embodiment, two circuits 12 are each connected to a single pin 26 that is in contact with the output region. As shown, pin 26 is disposed only on lid 20.

In other exemplary embodiments, additional pins 26 and associated circuits 12 can be used. For example, pins 26 can be inserted into base 22 and additional circuits 12 can be added to further increase the power provided by system 10. One such exemplary system is shown in FIG. 4 which depicts a similar system 10 as shown in FIG. 3 except this system 10 includes four circuits 12 with two circuits 12 on lid 10 and two circuits on base 22. As depicted in both FIGS. 3 and 4, system 10 circuits 12 are wire bonded to pin 26 at location points 29.

Figure 5:
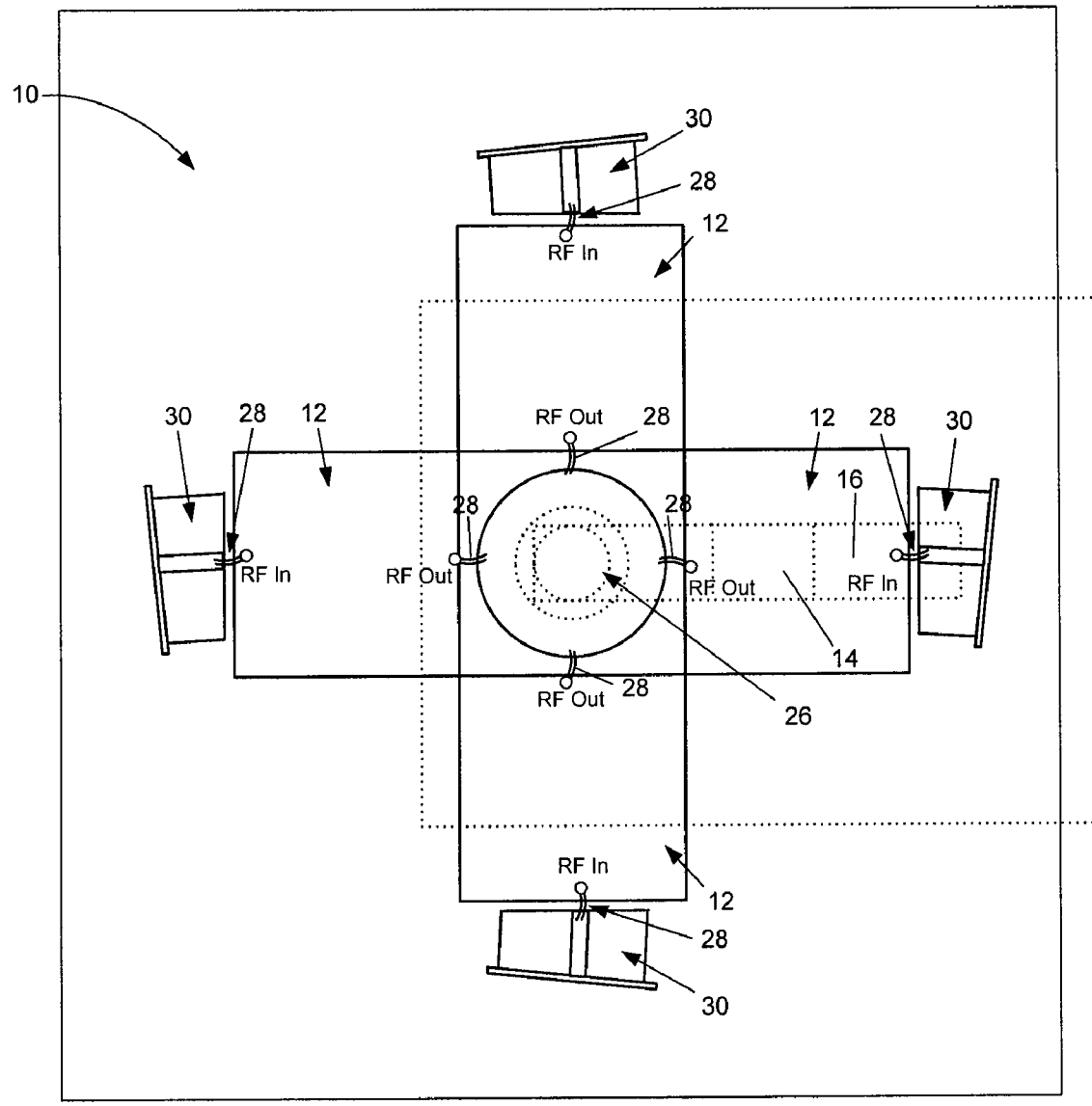
FIG. 5 illustrates a top view of a device used to split and combine power from four circuits comprising four circuits directly connected to a pin in accordance with one exemplary embodiment of the present invention.

In yet another exemplary embodiment, four or even eight circuits can be added to system 10 and various of the power combining devices disclosed herein can be used together to comprise system 10. With particular reference to FIG. 5, four circuits are placed on the either lid 20 or base 22 and connected to pin 26 by wirebond 28.

In another exemplary embodiment where eight circuits 12 are required, four additional circuits 12 could be placed on base 22. Thus, in accordance with various exemplary embodiments, radial combining of circuits 12 is facilitated by connecting multiple circuits 12 to pin 26. In yet other embodiments, six or seven circuits 12 are power combined by varying the number of circuits 12 placed on lid 20 and base 22 to reach the desired amount. In various exemplary embodiments, the larger the circuits 12 that are used, the larger pin 26 is for the instances when there are more than two circuits 12. Alternatively, the size of pin 26 my increase depending on the number of circuits 12 connected to a particular pin (i.e. a larger pin 26 is utilized with six circuits than is utilized with four circuits). In certain exemplary embodiments, circuits 12 are located close pin 26. Typically the higher the frequency, the smaller the distance between circuit 12 and pin 26.

In certain exemplary embodiments with numerous circuits 12, it may be beneficial to provide electrical isolation between circuits 12. One such embodiment is when system 10 is configured as a high power amplifier. If electrical isolation between various circuits 12 is not provided, certain systems 10 (such as a power amplifier) can have unacceptable amounts of loss and ripple. In one embodiment, electrical isolation between circuits 12 can be provided by utilizing a coupler that can provide isolation between two ports.

Figure 6:
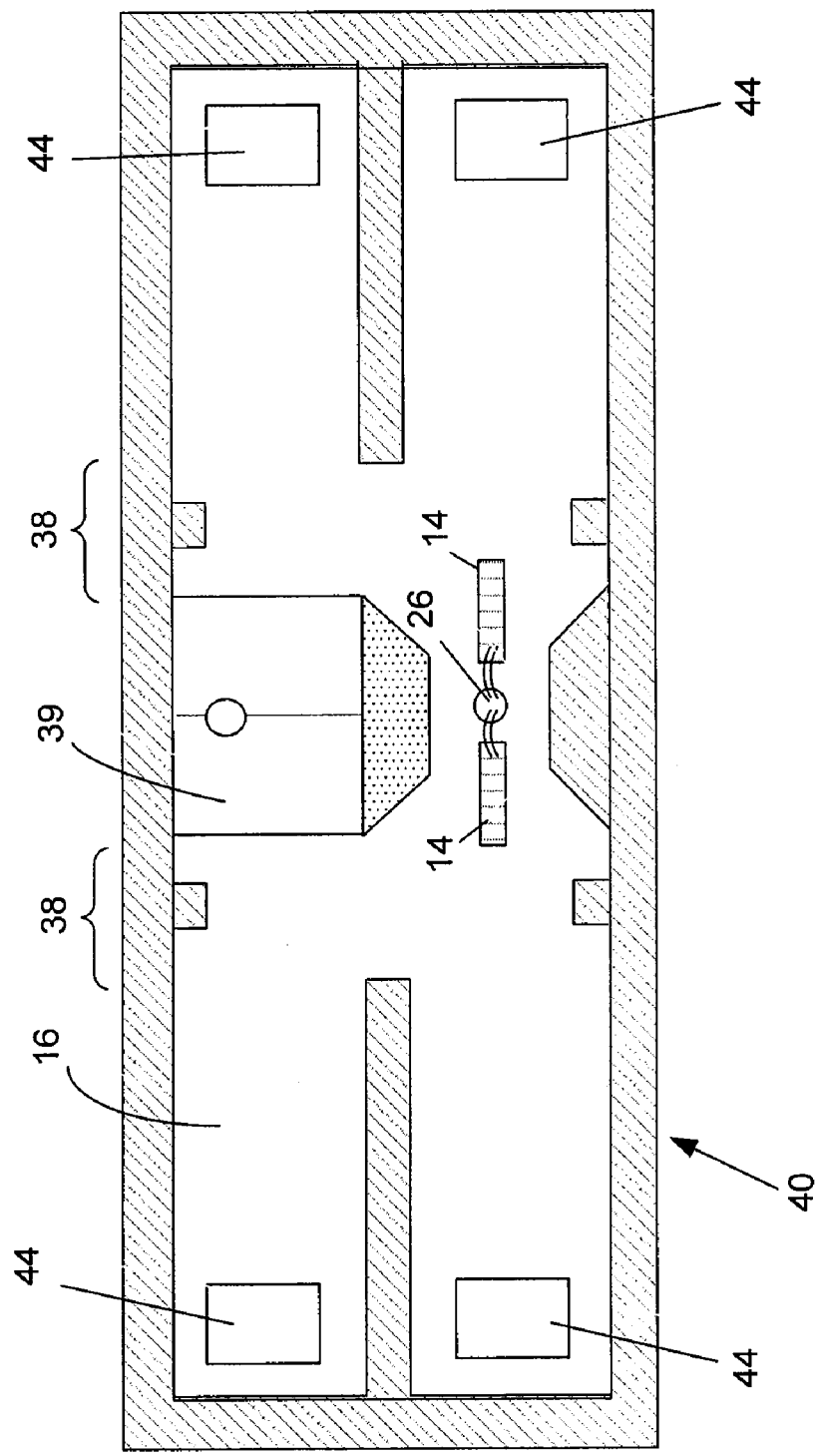
FIG. 6 illustrates the top view of one level of a multi-level electronic system compromising two waveguide couplers and a pin splitter configured to split one signal into four signals in accordance with one exemplary embodiment of the present invention.
Figure 7:
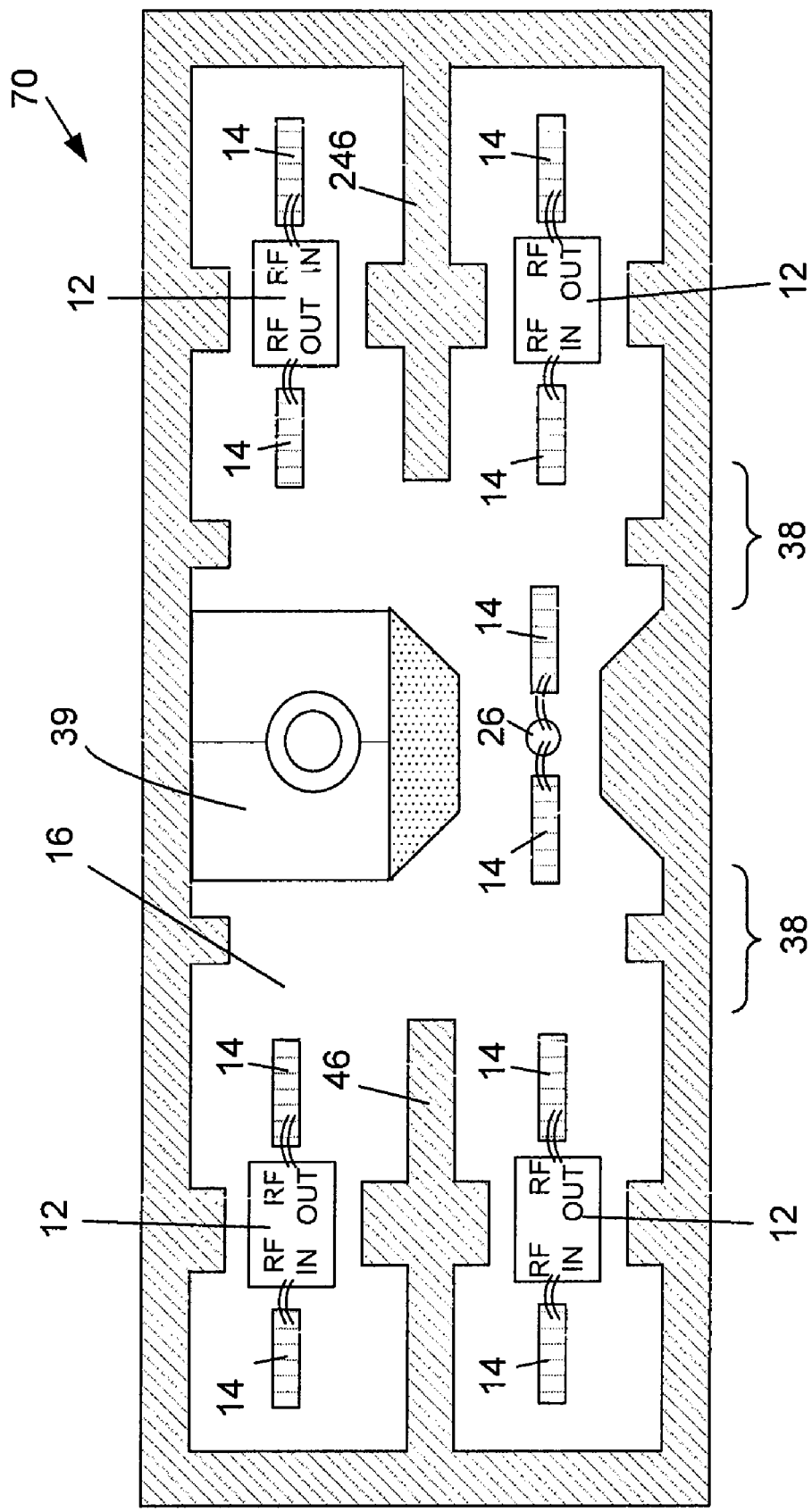
FIG. 7 illustrates a top view of another level of a multi-level section also comprising two waveguide couplers and a pin combiner configured to combine the energy of four signals into one signal in accordance with one exemplary embodiment of the present invention.

With particular reference to FIGS. 6 and 7 and according to one exemplary embodiment, system 10 utilizes multiple 90 degree hybrid couplers 38 to separate the various circuits 12. Specifically, FIGS. 6 and 7 depict sections of a multi-leveled electronic system such as a power amplifier that may be stacked on top of another. Energy amplified and/or combined at one section of a multi-level electronic system travels to another section where it is amplified and/or combined and/or split.

As shown in FIG. 6 in this embodiment, one exemplary coupler 38 is a three decibel coupler. A three decibel coupler functions as a 2 to 1 combiner or splitter. In accordance with various exemplary embodiments, the multi-level electronic system may comprise pin 26 and interface 14 and may further comprise a waveguide combiner. Energy enters at pin 26 and is split into two signals which in turn are split into four signals at a three decibel coupler such as coupler 38. The four energy signals exit through openings 44. In this exemplary embodiment, the isolated port of the three decibel coupler is terminated with an EM termination 39. Alternatively, energy could flow the opposite direction and be combined. For example, four separate electrical signals enter through openings 44 and are then combined into two separate signals at three decibel coupler 38. These two combined signals then combine again into an amplified single signal at pin 26. The amplified signal then exits through pin 26.

With reference to FIG. 7 and according to one exemplary embodiment of the present invention, this section of the multi-level electronic system comprises one or more walls 46 and houses four circuits 12. Energy from the splitting level referenced in FIG. 6 is inputted into circuits 12 and amplified. Energy enters and exits circuits 12 through a waveguide transition, such as interface 14 in one exemplary embodiment as shown. In this exemplary embodiment energy enters and exits circuit 12 through waveguide step launches. After amplification, the energy travels along energy transmission device 16 such as a waveguide cavity defined by the multi-level electronic system. Energy leaves coupler 38 through a waveguide interface device, such as interface 14 (e.g. a waveguide step launch) that are wire bonded to pin 26 where it is delivered to another section of the multi-level electronic system, such as the section shown. In other exemplary embodiments, pins 26 may be replaced with another three decibel coupler 38 and or waveguide opening (such as openings 44) to transition the energy to another level or section.

Coupler 38 can be any known device capable of electrically isolating power from two or more circuits 12. Certain exemplary couplers 38 comprise a three decibel split block 90 degree hybrid coupler, Lange coupler or a magic tee, or a Wilkinson power divider.

In accordance with various exemplary embodiments of the present invention, system 10 is configured to reduce the size and/or volume of the system that uses multiple circuits. In addition, system 10 described herein can be utilized in a multi-layered system that is configured to provide significant power amplification in a small space. In one exemplary embodiment, various circuits and microwave assemblies are utilized on various levels of the multi-level system.

Providing system 10 and its associated circuits 12 and interfaces 14 on a multi-level platform is advantageous in certain applications. Specifically, in certain applications where power combining is conducted, numerous circuits 12, interfaces 14, waveguides 16, and other devices are used. The more power amplification that is needed, typically the greater number of circuits 12, interfaces 14, and other related components as described herein are used.

A large number of circuits 12, interfaces 14, and related electronic devices increases the size of the power amplification system and the amplification system's "footprint" within the device that the power amplification system is installed. This is problematic in applications where the power amplifier device needs to be as small as possible. One such application are satellites that require as many small, light weight components as possible.

Figure 8:
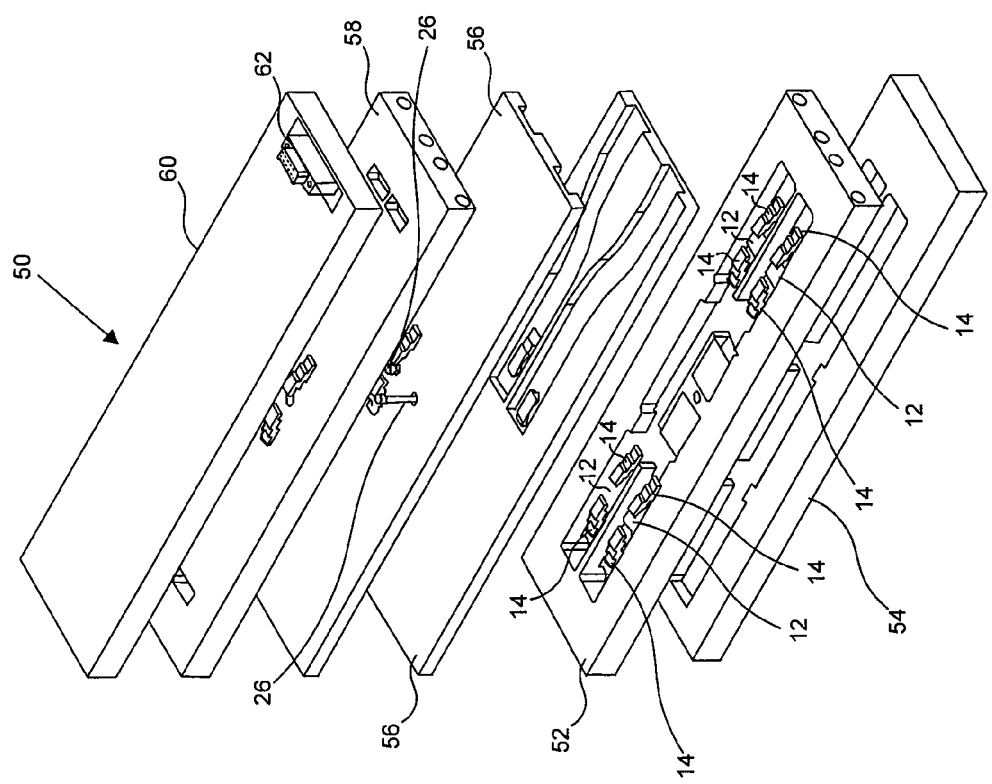
FIG. 8 illustrates an exploded perspective view of a power amplifier package as shown in FIGS. 6-7 in accordance with another exemplary embodiment of the present invention.
Figure 9:
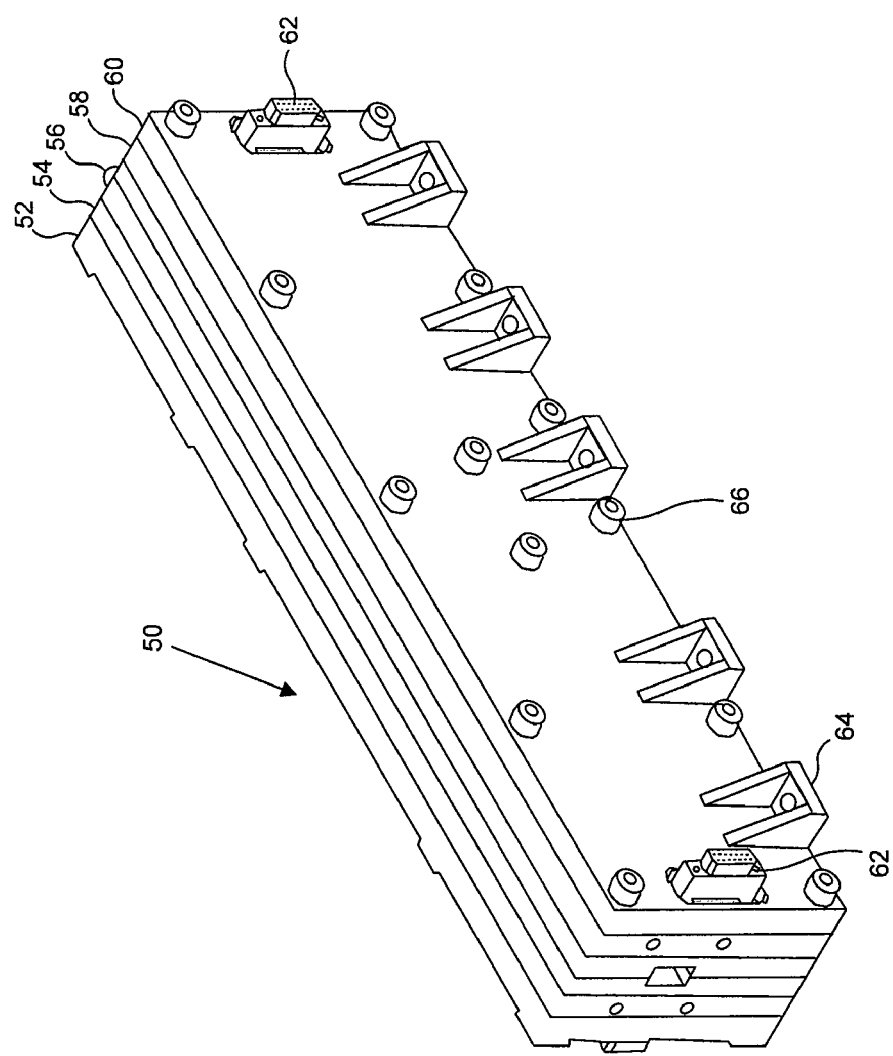
FIG. 9 illustrates a perspective view of an assembled power amplifier package with multiple chassis attached together in accordance with one exemplary embodiment of the present invention.

Implementing system 10 into a multi-level system enables the overall size or "footprint" of a power amplification system to be reduced compared to power amplification systems that are located on a single level. Turning now to FIGS. 8-17, various exemplary embodiments of a multi-level system, such as a power amplifier package 50, are depicted. Power amplifier package 50 is configured to increase the power density of energy entering power amplifier package 50 by splitting, amplifying, and combining a signal that is inputted into power amplifier package 50 as described herein. The improvement being in performing these various steps dispersed over more than one level or layer in an assembly. In various exemplary embodiments, the sections are in a parallel and overlying relationship as shown in FIG. 9.

Power amplifier package 50 comprises multiple chassis that are connected together to form power amplifier package 50. The term "chassis" as used in this application is meant to denote any structure or assembly, such as structure 18 noted above, in one plane that is capable of being connected to another structure in a separate parallel plane. Moreover, the term "chassis" is means the entire physical space within a particular structure, even though an adjoining structure may form part of that particular structure. For example, a "chassis" would include a floor, walls, and a lid, even if that lid was the floor of a chassis located on top of another chassis. In yet other exemplary embodiments, numerous different structural configurations could define various chassis. For example, three structures could be combined to form two chassis defining two levels.

Moreover, while specific structural details and functional aspects of certain chassis as well as a particular number of chassis is discussed herein, power amplifier package 50 can comprise any number of chassis and fall within the scope of the present invention. Moreover, any function can be performed on any one of the chassis or multiple functions can be performed on any one particular chassis and fall within the scope of the present invention.

There are numerous different embodiments of power amplifier package 50 according to the present invention. With reference to FIG. 8 and in accordance with another exemplary embodiment of the present invention, power amplifier package 50 comprises first power amplifier chassis 52, first splitter chassis 54, an input/output chassis 56, second splitter chassis 58, and a second power amplifier chassis 60. Power amplifier package 50 may further comprise pin 26 which is configured to transmit an energy signal from one chassis to another. In this exemplary embodiment pin 26 is used to allow an energy connection between input/output chassis 56 and all chassis to and from input/output chassis 56. Therefore, pin 26 can be used as a pathway between the other chassis such as first power amplifier chassis 52 and first splitter chassis 54.

Figure 10:
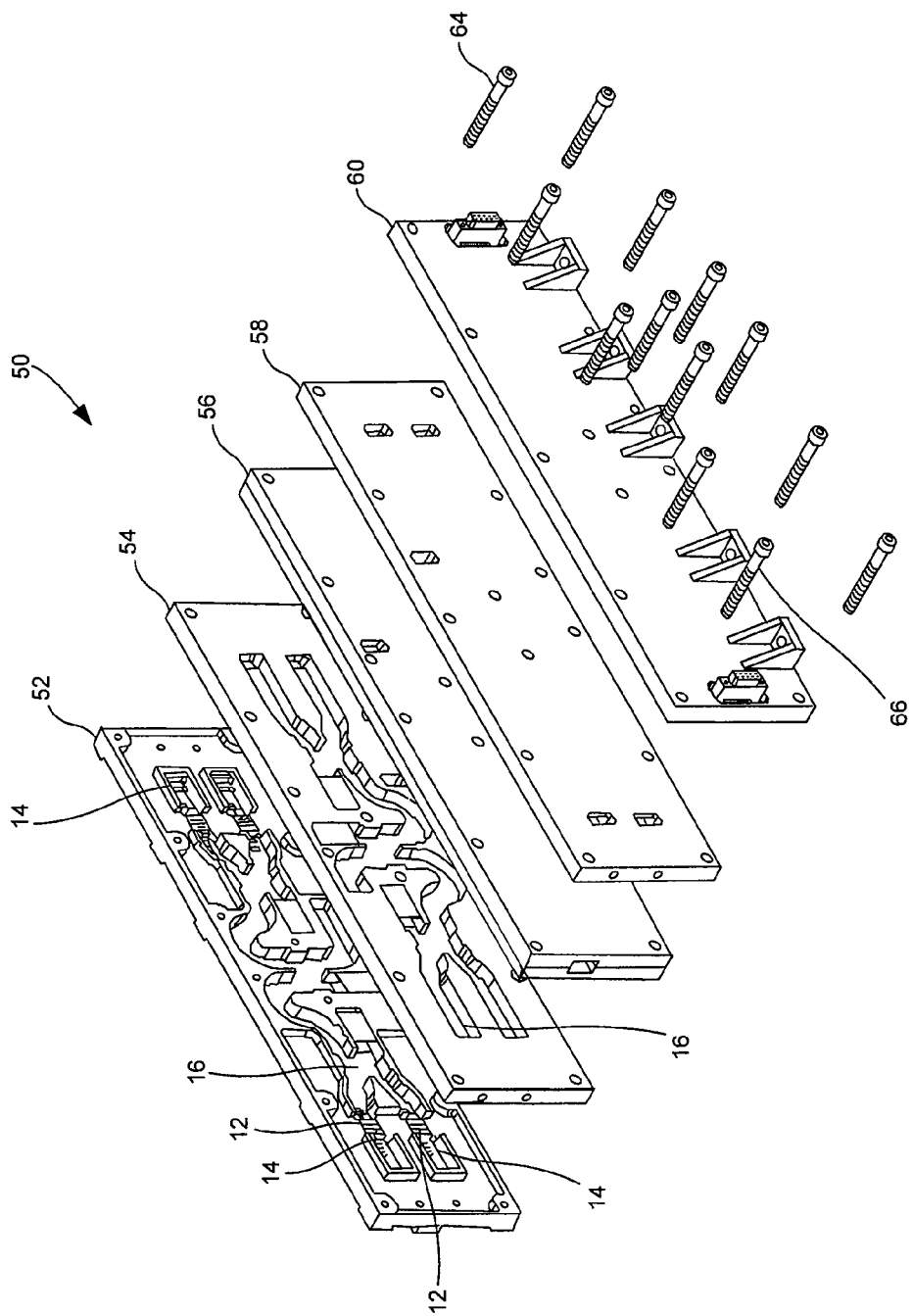
FIG. 10 illustrates a perspective view of a disassembled power amplifier package with multiple chassis in accordance with one exemplary embodiment of the present invention.

With specific reference to FIGS. 9 and 10 and in accordance with another exemplary embodiment of the present invention, power amplifier package 50 comprises first power amplifier chassis 52, first splitter chassis 54, an input/output chassis 56, second splitter chassis 58, and a second power amplifier chassis 60. Power amplifier package 50 can further comprise a connection interface 62 to connect power amplifier package 50 with other devices. One exemplary connection member 62 is a DC power nano connector. Power amplifier package 50 can further comprise feet 64 to secure power amplifier 50 to a separate structure. Power amplifier package 50 may further comprise screws 66 or another type of device configured to hold the chassis together. In other exemplary embodiments, the various chassis components can be welded together, glued together, or attached with pins or other known connection mechanisms.

In this exemplary embodiment, circuits 12 are located in a chassis such as power amplifier package that is on the exterior of power amplifier package 50. However, the location of circuits 12 can certainly be changed to other interior chassis and fall within the scope of the present invention.

As discussed in greater detail below, energy, such as EM energy, enters power amplifier package 50 at input/output chassis 56 and travels through and is amplified within power amplifier package 50 and exits power amplifier package 50 at input/output chassis 56.

Figure 11:
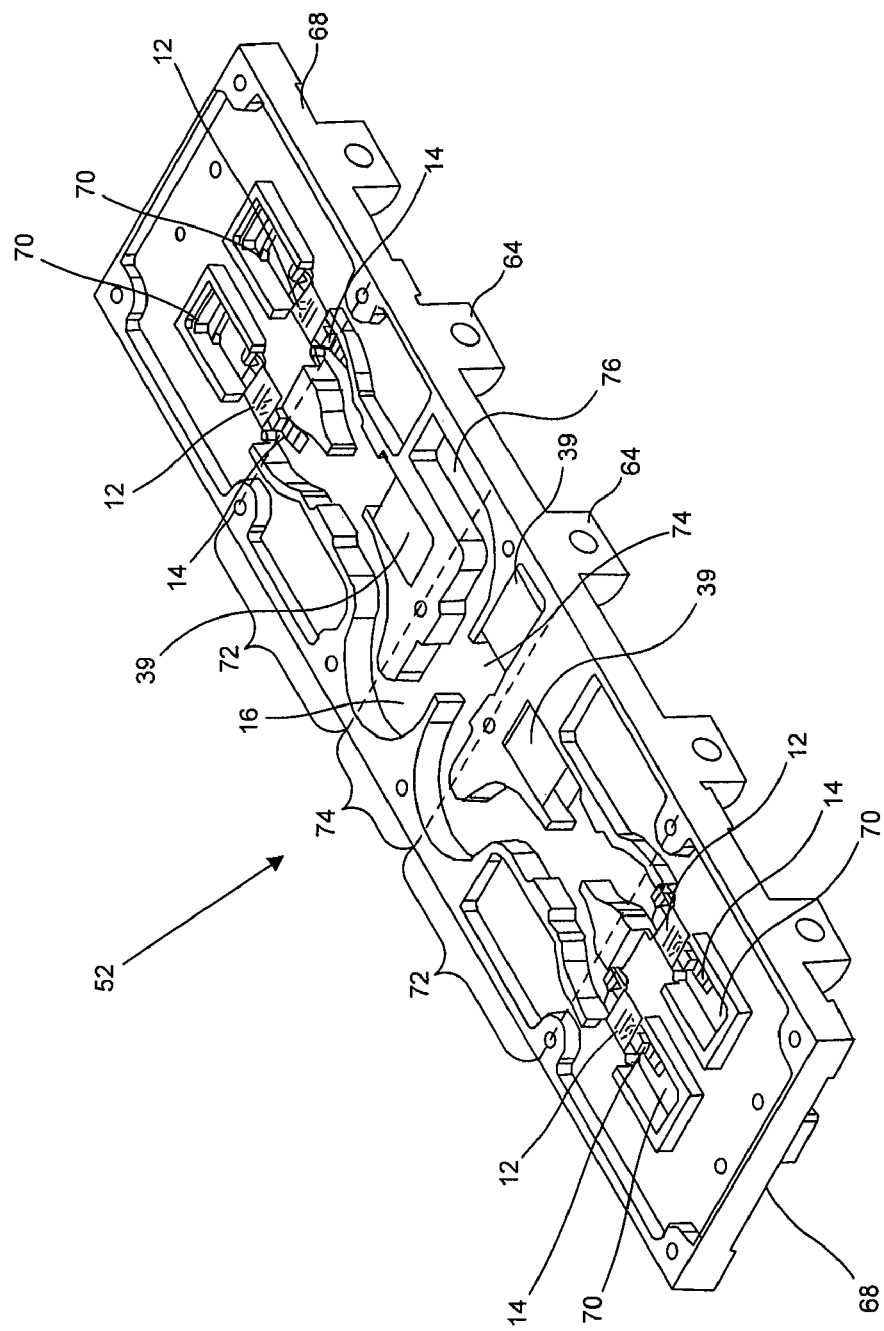
FIG. 11 illustrates an isometric view of a power amplifier chassis in accordance with one exemplary embodiment of the present invention.

With reference to FIG. 11, a first power amplifier chassis 52 according to one exemplary embodiment of the invention is described. First power amplifier chassis 52 comprises amplifier housing 68 which further defines energy transmission device 16 that comprises a waveguide channel in this exemplary embodiment. Amplifier housing 68 can be constructed of various conductive materials discussed above such as a copper base material which is covered with a nickel finish layer and finally a gold layer. Energy transmission device 16 may further comprise EM termination 39 which prevent energy flow and allow for energy combination as discussed herein. First power amplifier chassis 52 further comprises circuits 12 and interfaces 14 that are connected to circuits 12. Moreover, in this exemplary embodiment, first power amplifier chassis 52 further comprises an EM termination 39 disposed within energy transmission device 16.

In this exemplary embodiment, power amplifier chassis 52 comprises one or more waveguide transition 70. Waveguide transition 70 is in communication with circuit 12 via interface 14. Each waveguide transition 70 is configured to deliver an energy signal to circuit 12 via interface 14. Waveguide transition 70 is also configured to receive energy from another chassis, such as first splitter chassis 54. Energy transmission device 16 further defines various couplers where two or more EM signals are combined. Specifically, first combination points 72 are located where two signals of energy from circuits 12 are combined. In one exemplary embodiment, chassis 52 comprise first combination points 72, with one on either side of first power amplifier chassis 52. During combination at each first combination point 72, two energy signals are combined into one signal.

Each combined signal from first combination point 72 is then combined into a single EM energy signal at a second combination point 74 to form a power amplifier chassis output signal. This single power amplifier chassis output signal enters a waveguide transmission channel 76 where it travels to another chassis, such as input/output chassis 56 via waveguide transition 70. In other exemplary embodiments, other channels, or other conductive devices function to serve as a pathway from one chassis to another. For example, as discussed above in connection with FIG. 8, pin 26 can be used instead of waveguide transmission channel 76 to transport energy from first power amplifier chassis 52 to another chassis such as input/output chassis 56.

Figure 12:
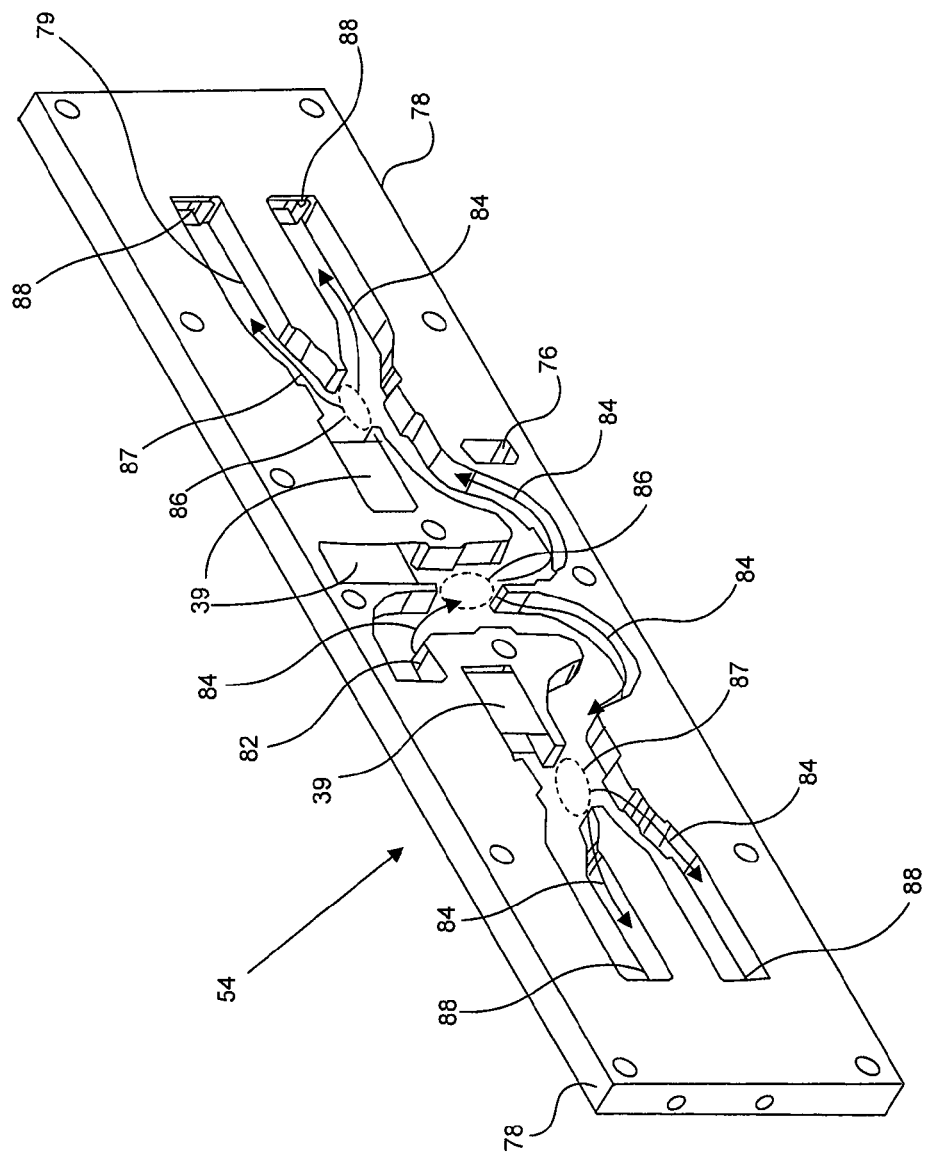
FIG. 12 illustrates a perspective view of a splitter chassis in accordance with one exemplary embodiment of the present invention.

With reference now to FIG. 12 and accordance with one exemplary embodiment of the present invention, first splitter chassis 54 will now be discussed. First splitter chassis 54 comprises a splitter housing 78 which defines splitter channel 79 which functions as an energy transmission device within first splitter chassis 54. As used throughout, the term "splitter," "splitter channel," or splitting region means any electrical or mechanical device configured to received one electric signal such as an EM signal and divide it into two or more signals. Further, the terms "combiner," "combining region" means any electrical or mechanical device configured to receive two or more electrical signals such as EM signals and combine them into fewer signals than received.

For example, splitter housing 78 may include a waveguide. Splitter housing 78 can be constructed of various conductive materials as noted above such as a copper base material which is covered with a nickel finish layer and finally a gold layer. First splitter chassis 54 further comprises waveguide transmission channel 76 configured to transport an amplified energy signal from first power amplifier chassis 52 to input/output chassis 56. In this exemplary embodiment, first splitter chassis 54 further comprises one or more EM termination 39.

The first combination point 72 and second combination point 74 collectively represent a 4:1 EM signal combiner or splitter. While specific structural details have been disclosed throughout, various modifications could be made and still fall within the scope of the present invention. Thus, various other structural devices capable of this type of splitting and combining fall within the scope of the present invention. Further, it should be noted that while FIG. 12 depicts a specific configuration for splitter channel 79 and shows only three splitting regions 86, that the size and shape of splitter channel 79 can be varied and fall within the scope of the present invention. Further, first splitter chassis 54 can comprise more or less splitting regions 86 and fall within the scope of the present invention. For example, in other exemplary embodiments, first splitter chassis 54 can have one, four, five, or more splitting regions, such as splitting region 86. Any number of splitting regions 86 can be used and fall within the scope of the present invention.

Figure 13:
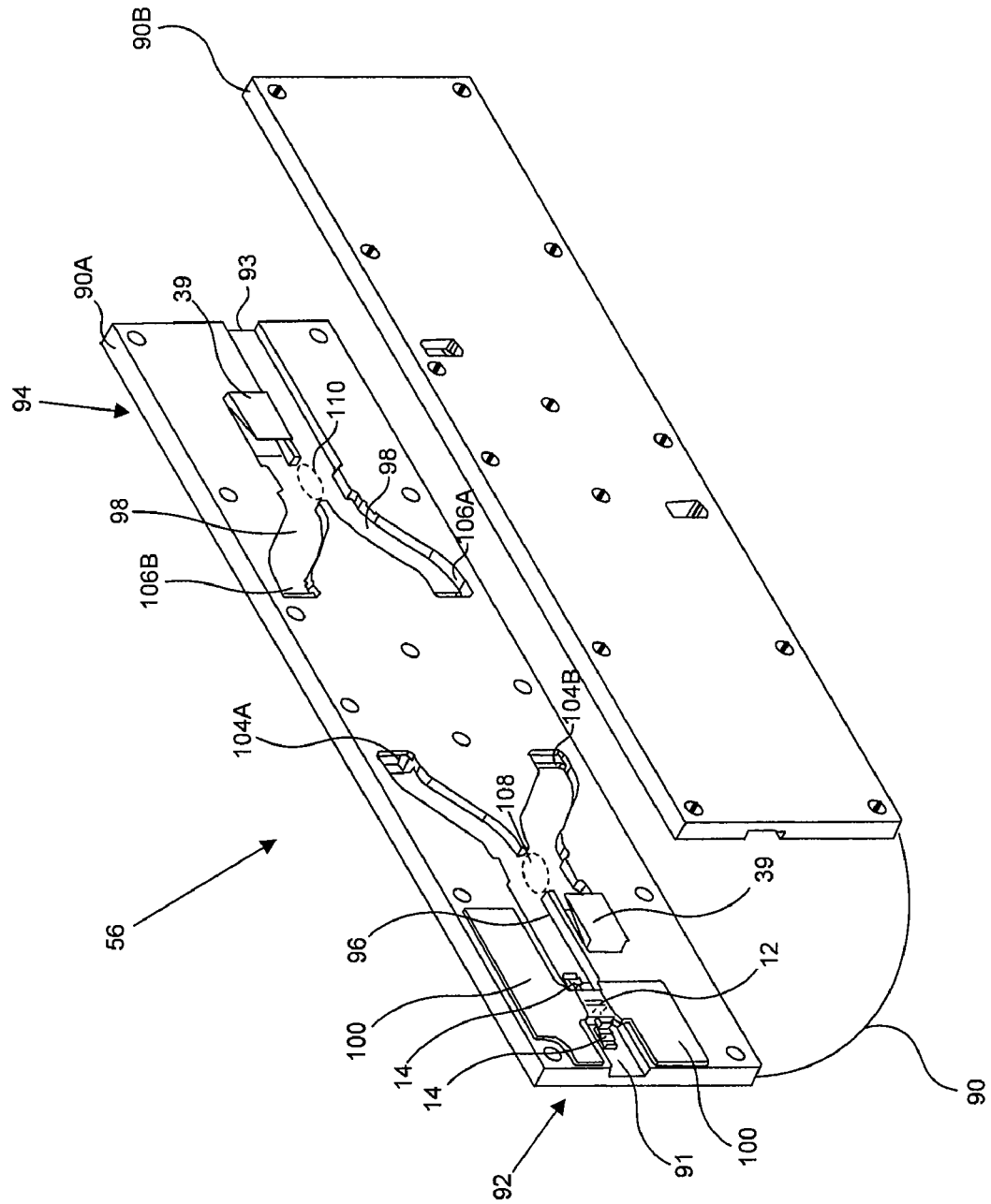
FIG. 13 illustrates a perspective view of an input/output chassis in accordance with one exemplary embodiment of the present invention.
Figure 14:
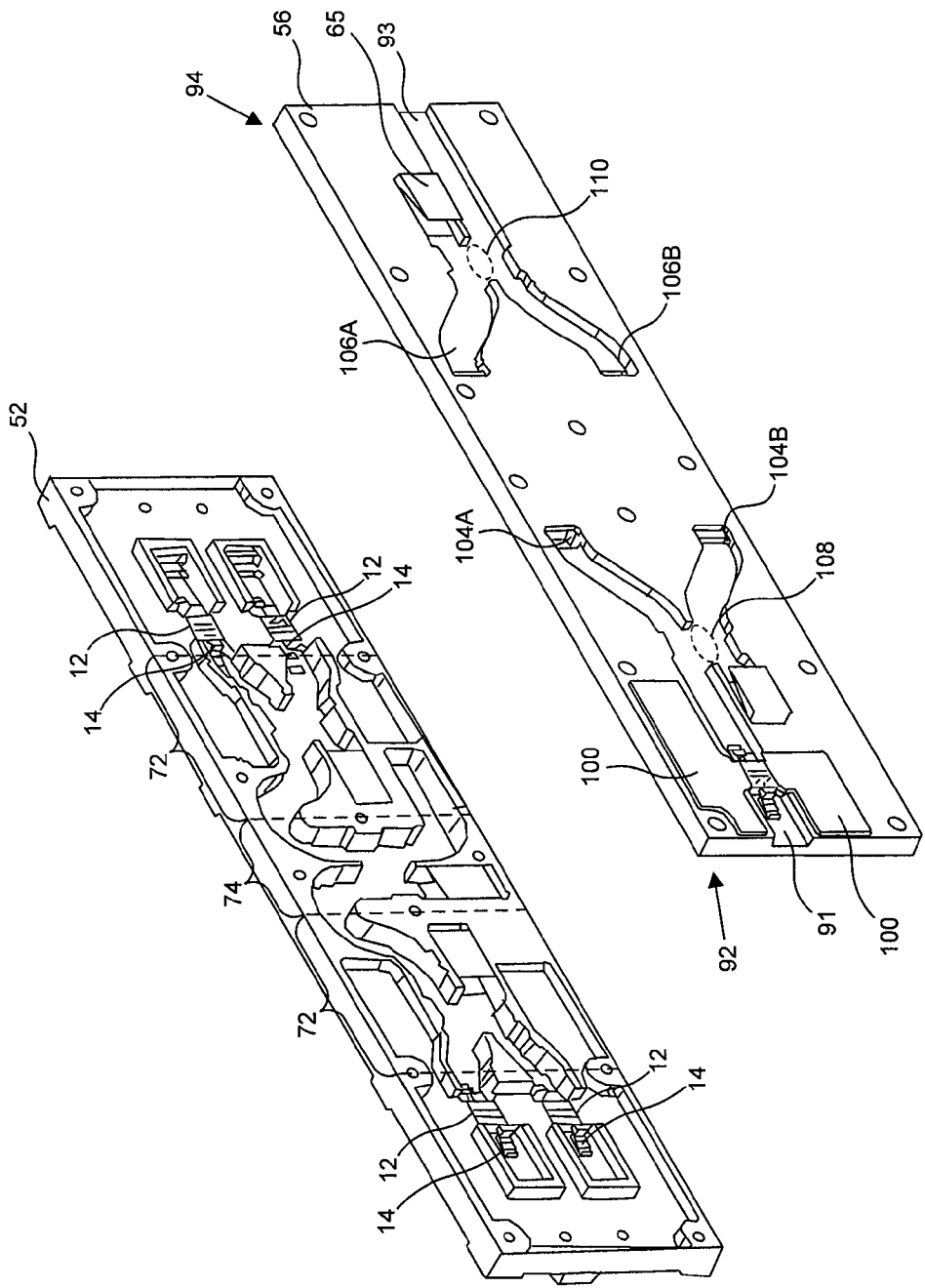
FIG. 14; illustrates another exploded perspective view of a power amplifier package in accordance with another exemplary embodiment of the present invention.

Turning now to FIG. 13 and in accordance with one exemplary embodiment of the present invention, input/output chassis 56 will now be described. Input/output chassis 56 comprises an input 91 configured to receive energy and an output 93 configured to output amplified energy. In other exemplary embodiments, input 91 and output 93 are located on separate levels or chassis.

In this exemplary embodiment, input/output chassis 56 comprises an input/output housing 90 that comprises a two part chassis with a first half 90A and a second half 90B that are attached with screws or another attachment mechanism such as pins or welding or gluing first half 90A to second half 90B. In one exemplary embodiment, first half 90A is symmetric to second half 90B. In another exemplary embodiment, input/output housing 90 is formed entirely in first half 90A with second half 90B primarily forming a cover over the channels in first half 90A. In another exemplary embodiment, input/output housing 90 is formed from a single housing and is a single chassis similar to first splitter chassis 54 and first power amplifier chassis 52.

Input/output housing 90 is constructed from similar materials as amplifier housing 68 and splitter housing 78. Specifically, in this exemplary embodiment, input/output housing 90 is constructed of a copper base material with a nickel finish that is further covered in gold. Input/output chassis 56 may further compromise an input end 92 and an output end 94. Input end 92 is configured to receive energy and direct it into other chassis layers of power amplifier package 50 for amplification. Output end 94 is configured to receive energy from other chassis layers of power amplifier package 50 and to output the amplified energy from power amplifier package 50. Input/output chassis 56 may further comprise a bias and control unit, such as a PCB bias and control 100 and an EM termination 39.

In one exemplary embodiment, input/output chassis 56 may also comprise interface 14 and a circuit 12 which is configured to initially amplify energy that enters power amplifier package 50. In other exemplary embodiments, circuit 12 or interface 14 are eliminated from input/output chassis 56. Input channel 96 and output channel 98 are waveguide channels in this exemplary embodiment of the present invention. Input channel 96 connects to input waveguide transition 104A and 104B near input end 92. Output channel 98 connects to output waveguide transition 106A and 106B near output end 94. Input waveguide transition 104A and 104B are in communication with output waveguide transition 106A and 106B through the various energy transmission devices 16, interfaces 14, and other components within power amplifier package 50.

Input channel 96 further defines input splitting region 108 configured to split a single energy signal into two separate signals of energy prior to amplification. Conversely, output channel 98 further defines a combining region 110 where two amplified energy signals are combined into a single signal post amplification before exiting output 93.

With reference again to FIG. 9 and in accordance with one exemplary embodiment of the present invention, power amplifier package 50 further comprises a second splitter chassis 58 and a second power amplifier chassis 60. In one exemplary embodiment, second splitter chassis 58 is symmetrical and identical to first splitter chassis 54. Further, second power amplifier chassis 60 is symmetrical and identical to first power amplifier chassis 52. Since these chassis are identical to ones previously discussed, a detailed explanation of second splitter chassis 58 and second power amplifier chassis 60 will not be repeated.

However, in other exemplary embodiments, second splitter chassis 58 can be different than first splitter chassis 54. For example, second splitter chassis 58 can have more or less splitting regions 86, splitter channel 79 can be shaped differently, and energy can travel through second splitter chassis in a different manner. In yet another exemplary embodiment, second splitter chassis 58 (like first splitter chassis 54) can be eliminated.

Similarly, second power amplifier chassis 60 can be different than first power amplifier chassis 52 in another exemplary embodiment. Specifically, second power amplifier chassis 60 can have more or less circuits 12 than first power amplifier chassis 52, the number and shape of interfaces 14 can also vary between first power amplifier chassis 52 and second power amplifier chassis 60. Further, energy transmission device 16 can differ between first power amplifier chassis 52 and second power amplifier chassis 60. In yet other exemplary embodiments, second power amplifier 60 can be eliminated, provided that the modification is suitable for the application that second power amplifier 60 and power amplifier package 50 are used for.

In yet other exemplary embodiments as noted above, the number of chassis used to create power amplifier package 50 can be modified according to the specific application that power amplifier package 50 will be used for. Moreover, the order of the chassis can be modified or certain chassis can be removed or added. For example, with reference again to FIG. 8, splitter chassis 54 is located on the outer edge of power amplifier package 50, not in between input/output chassis 56 and power amplifier chassis 52 as described in other exemplary embodiments.

Figure 16:
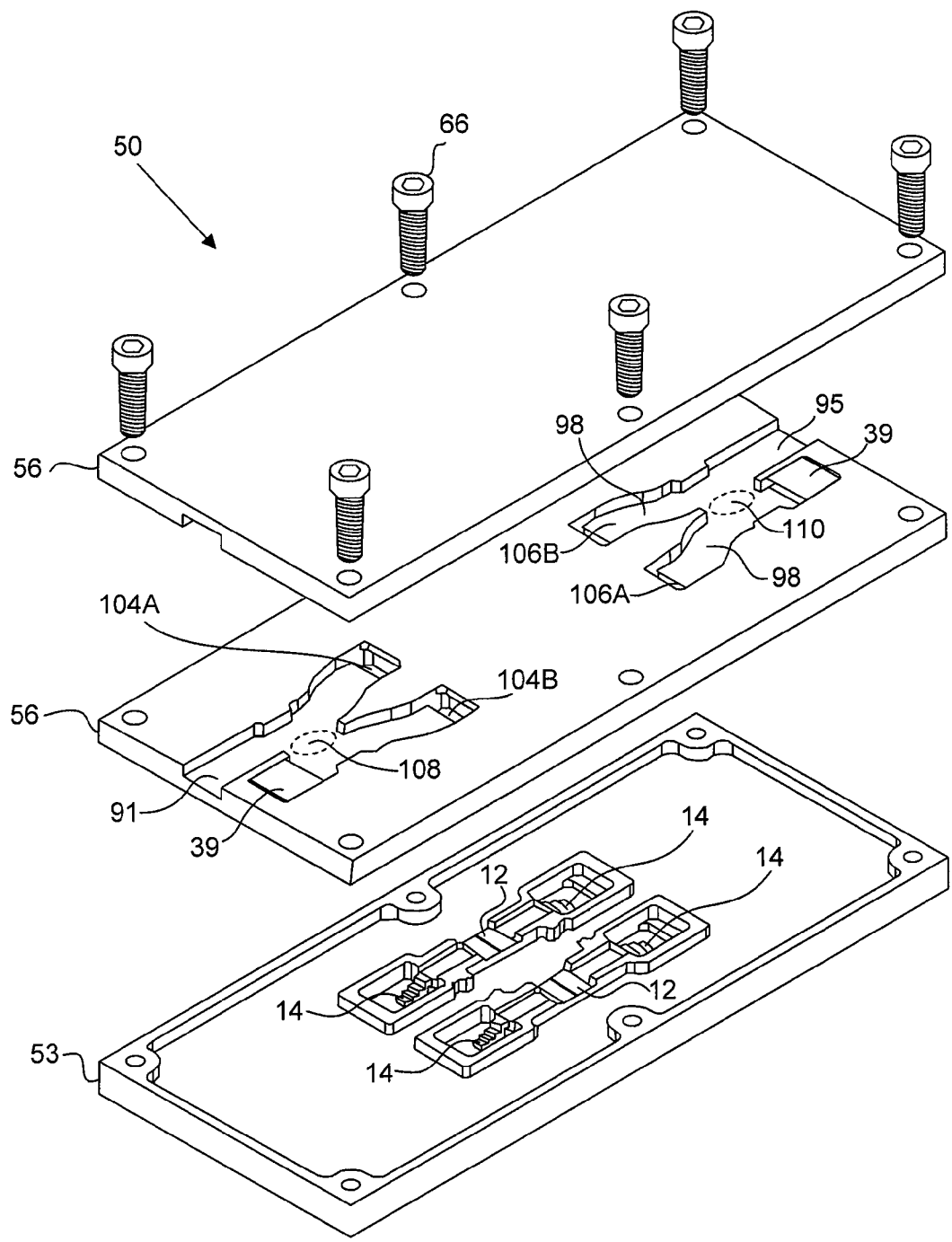
FIG. 16 illustrates a perspective view of a power amplifier package with a power amplification chassis and an input/output chassis according to another exemplary embodiment of the present invention.

Yet another exemplary embodiment depicted in FIG. 16 depicts a power amplifier package 50 comprising a power amplifier chassis 53 and input/output chassis 56. As such, a splitter chassis per se is not utilized. In this exemplary embodiment, input/output chassis 56 is configured to receive, split, combine, and output energy signals. In this exemplary embodiment, power amplifier chassis 53 is configured to receive energy signals from input/output chassis 56 and amplify the energy signals before redirecting the amplified signals back to input/output chassis 56 where the amplified energy signals exit power amplifier package 50. Input/output chassis 56 may further comprise splitting region 108 and combining region 110. Furthermore, power amplifier chassis 53, in other not shown exemplary embodiments, may comprise splitting and combining regions.

Specifically, according to this exemplary embodiment, an energy signal enters power amplifier at input 91, is split into first and second signals which are then directed into power amplifier chassis 53 where each signal is amplified as discussed above. The amplified energy signals exit power amplifier chassis 53 and travel directly back into input/output chassis 56 before being combined and leaving power amplifier package 50.

Figure 17:
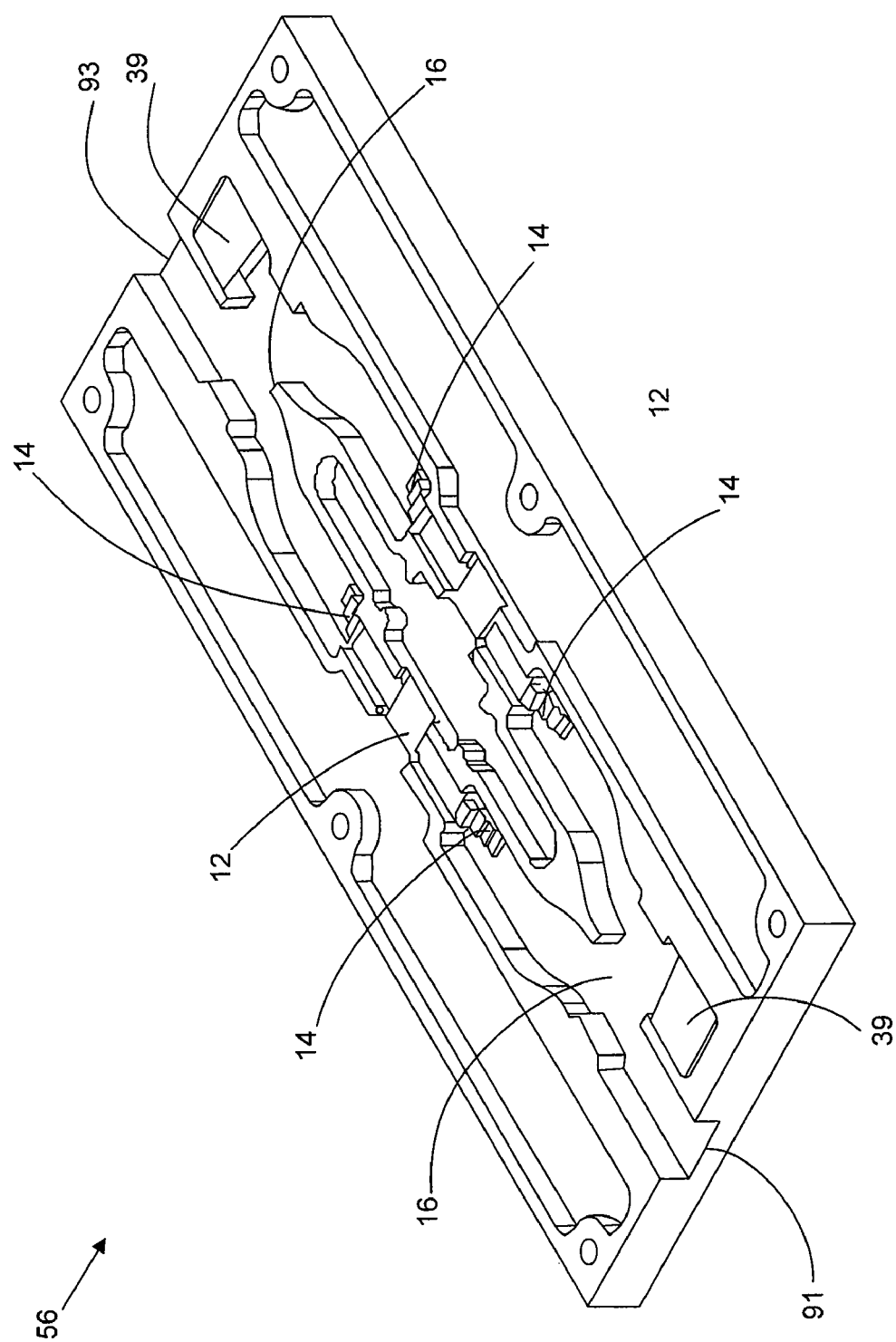
FIG. 17 illustrates a perspective view of a power amplifier package with a single chassis according to an exemplary embodiment of the present invention.

In yet another exemplary embodiment depicted in FIG. 17, power amplifier package 50 may comprise only a single level such as input/output chassis 56. In this exemplary embodiment, there is one splitter and one combination defined by energy transmission device 16. Moreover, the number of circuits 12 used can very in this and in other exemplary embodiments. For example, in a single level embodiment, two circuits 12 may be used. In other exemplary embodiments, more splitters, combiners and circuits may be used. Further, in this exemplary embodiment, input/output chassis 56 comprises input 91 and output 93.

A single level power amplifier package 50 further reduces size and allows power amplifier package 50 be used in small areas. For example, a single level power amplifier package 50 may measure approximately two inches wide by three inches long and have a height of a half inch.

Figure 15:
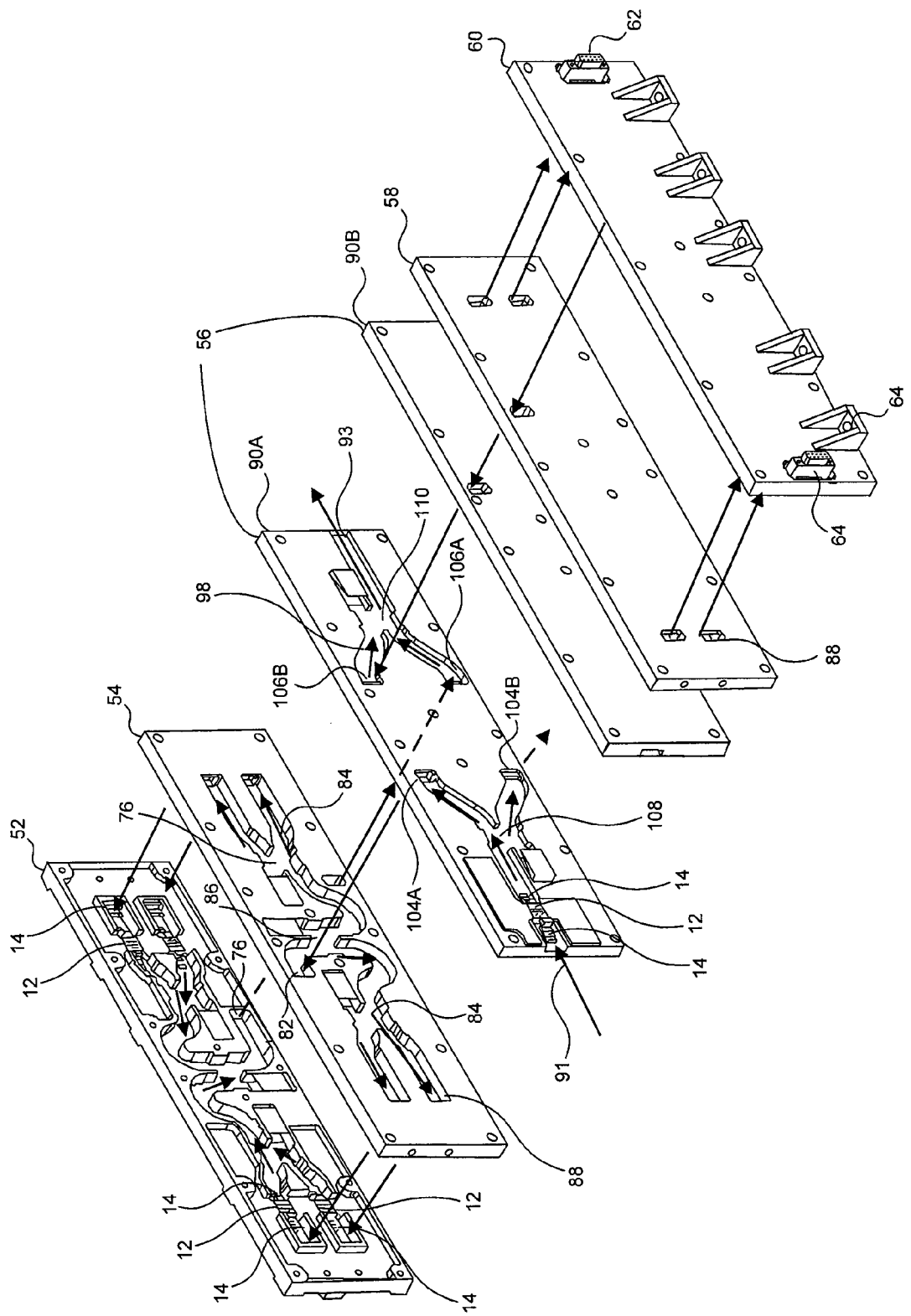
FIG. 15 illustrates another exploded perspective view of a power amplifier package that shows the path that an electrical signal would travel from entry to exit of the power amplifier package.

Turning now to FIG. 15, and with continued reference to FIGS. 11-13 the process and path that an energy signal makes through power amplifier package 50 will be discussed. The arrows depict the exemplary direction the energy signal would travel in this example. In this exemplary embodiment, power amplifier package 50 is the one depicted in FIGS. 9-13, however, as discussed above, various modifications can be made to power amplifier package 50, and the path and steps set forth below relate to one exemplary non-limiting embodiment of the present invention.

An energy signal enters input/output chassis 56 at input 91. After entering input/output chassis 56, the energy signal passes over an interface 14 and travels through circuit 12 where it is amplified. The energy signal then launched, via another interface 14 and proceeds to travel along input channel 96 until it reaches splitting region 108 where it is split into two separate energy signals. One of those two separate signals proceeds to travel to input waveguide transition 104A and is directed to first splitter chassis 54. The other signal is directed to input waveguide transition 104B and is directed into second splitter chassis 58.

The energy signal enters first splitter chassis 54 at splitter waveguide transition 82 and then travels in through splitter channel 79 until it reaches first splitting region 86 where it is split into two additional energy signals. Each energy signal follows the direction set forth by arrows 84 as it travels along splitter channel 79 until it reaches the second splitting region 86 where each signal is split once again into two separate energy signals. The other energy signal that was directed into second splitter chassis 58 from splitting region 108 has been split the same number of times in the same manner as in this exemplary embodiment where second splitter chassis 58 is symmetric with first splitter chassis 54.

At this point, the original energy signal has been split once in input/output chassis 56, two times in first splitter chassis 54, and two times in second splitter chassis 58. Thus, the original energy signal has been split into a total of eight energy signals that are prepared for amplification at first power amplifier chassis 52 and second power amplifier chassis 60.

The four separate energy signals travel into first power amplifier chassis 52 by exiting splitter chassis 54 at exit points 88. Upon entry at first power amplifier chassis 52 in this exemplary embodiment, the energy signals proceed along interfaces 14 and pass through circuits 12 and then through another set of interfaces 14 before being directed along a waveguide (energy transmission device 16). The energy signals are amplified at circuits 12.

Throughout this disclosure, circuits 12 may comprise Power Amplifier circuits, e.g. a MMIC Power Amplifier. In another example, circuits 12 up convert, e.g. a MMIC, block up converter (BUC). In this exemplary embodiment (which corresponds to the exemplary power amplifier package 50 shown in FIGS. 6-15), there are four amplified energy signals, one signal for each circuit 12. With particular reference to FIGS. 11 and 15, two of these amplified energy signals are on the left side of power amplifier chassis 52 and two are on the right side of power amplifier chassis 52. The two energy signals on the right and the two energy signals on the left combine at combination points 72.

At this point, the four amplified energy signals are reduced to two combined and amplified energy signals within first power amplifier chassis 52. Similarly, due to the symmetric relationship between first power amplifier chassis 52 and second power amplifier chassis 60, there are two combined and amplified energy signals in second power amplifier chassis 60 as well.

The two amplified energy signals converge and are combined into a single energy signal at second combination point 74. In this exemplary embodiment, after combination at second combination point 74, the single energy signal has approximately the combined power of the output power of the four circuits 12. As one skilled in the art will appreciate, due to the symmetric relationship between the first power amplifier chassis 52 and second power amplifier chassis 60, the two amplified energy signals in second power amplifier chassis 60 are combined into one energy signal as well.

The combined energy signal is directed out of first power amplifier chassis 52 through waveguide transmission channel 76 and into input/output chassis 56. In this exemplary embodiment, the single energy signal from first power amplifier chassis 52 enters input/output chassis 56 through waveguide transition 106A and the single energy signal from second power amplifier chassis 60 enters input/output chassis 60 through waveguide transition 106B.

Upon entering input/output chassis 56, both energy signals travel along output channel 98 and converge at combining region 110 to form a single energy signal that has approximately the combined power of the two energy signals that were joined to create it. This single energy signal exits power amplifier package 50 at output 93.

In this exemplary embodiment, the various chassis used to construct power amplifier package 50 are built with sufficient precision to allow the phase of energy from first power amplifier chassis 52 and phase of energy amplified in second power amplifier 60 to be maximally combined.

Therefore, according to this exemplary embodiment of a power amplifier package 50, a single energy signal enters power amplifier package 50 and is split into two or more energy signals that are then split again, amplified, combined, and then combined again to create a much more powerful energy signal that exits power amplifier package 50. In an exemplary embodiment, energy signals travel through at least three parallel overlaying planes. These operations occur on at least two parallel overlying planes. As the energy signals travel through power amplifier package 50, they may pass through various circuits 12 and interfaces 14 as described herein.

Further, it should be reiterated that while certain specific examples of a power amplifier package 50 have been described herein, that numerous other power amplifier package 50 could be used and fall within the scope of the present invention. Certain other exemplary embodiments comprise, but are not limited to, packages that initially split the energy signal entering power amplifier package into three or four separate signal as opposed to two signals as described in detail above. Alternatively, first power amplifier chassis 52 and first splitter chassis 54 may not be symmetrical with second splitter chassis 58 and second power amplifier chassis.

In yet another exemplary embodiment, the present invention comprises an electrical system comprising: a first circuit producing a first EM signal at a first power; a second circuit producing a second EM signal at a second power; wherein the first circuit is directly connected to an energy transmission device using a first interface; wherein the second circuit is directly connected to the energy transmission device using a second interface; and wherein the output signals of both the first circuit and the second circuit are combined such that the energy transmission device communicates a third signal at a third power wherein the third power is a combination of the first power and the second power.

In yet another exemplary embodiments, the present invention comprises an electronic system comprising: an assembly comprising a first section defining a first energy pathway and a second section defining a second energy pathway, wherein the first section and the second section are in a parallel orientation and adjacent to one another and the first pathway is in communication with the second pathway; wherein the first section further comprises a circuit; and wherein the second section comprises an input and an output that is in communication with the second pathway.

In yet other exemplary embodiments the first section further comprises a step launch interface connected to the circuit. Alternatively, the system may further comprise an isolation wall located between the step launch interface and the circuit.[1] Alternatively, the system further comprises a pin traversing from the first section to the second section wherein the pin is configured to form an energy pathway between the first section and the second section. Alternatively, the first pathway and the second pathway comprise a waveguide and further comprise a waveguide transition between the first section and the second section. Alternatively, the circuit is a monolithic microwave integrated circuit. Alternatively, the system further comprises a step launch interface connected to the monolithic microwave integrated circuit by a wirebond. Alternatively, the system further comprises a waveguide transition between the first pathway and the second pathway.

[1] It should be noted herein that the term "alternatively" means both the alternative or the combination of the foregoing and not necessarily limit the invention to one embodiment or the other.

In yet another exemplary embodiment, the present invention comprises a power amplifier package comprising a first power amplifier assembly comprising at least two circuits connected to a power amplifier assembly pathway; a first splitter assembly adjacent and connected to the first power amplifier assembly by a waveguide transition comprising a splitter pathway that is in communication with the first power amplifier assembly pathway; and an input/output assembly adjacent and connected to the first splitter assembly on one side and a second splitter assembly on an opposing side from the first power assembly that is connected to the first splitter assembly by a waveguide transition wherein the input/output assembly comprises an input/output pathway and wherein the second splitter assembly is adjacent to and connected to a second power assembly that comprises at least two additional circuits.

In yet other exemplary embodiments the input/output assembly comprises an input port configured to intake an energy signal and an output port configured to output an amplified energy signal. Alternatively, the at least two circuits are connected to at least two impedance matching interfaces. Alternatively, the circuits are monolithic microwave integrated circuits.

In yet other exemplary embodiments the present invention comprises a power amplifier package comprising: a first chassis comprising at least a first and second circuits and at least a first and second interfaces connected to the at least first and second circuits; a second chassis comprising a first splitter assembly; a third chassis comprising an EM input, a third chassis splitter in communication with the EM input, and a first pathway in communication with the second chassis and a second pathway in communication with a fourth chassis, and a EM output, wherein the EM input in configured to receive an energy signal and direct it into the first pathway and the second pathway and wherein the output is configured to direct amplified EM energy out of the third chassis wherein the fourth chassis comprises a second splitter assembly; a fifth chassis comprising at least a third and fourth circuits and a third and fourth interfaces connected to the at least a third and fourth circuits; and wherein the first chassis, the second chassis, the third chassis, the fourth chassis, and the fifth chassis are in a parallel relationship to one another and in separate planes.

In yet other exemplary embodiments, the third chassis further comprises a circuit adjacent to the EM input. Alternatively, the second chassis comprises at least one splitting region. Alternatively, the first chassis comprises at least one combination point.

In yet other exemplary embodiments, the present invention comprises a power amplifier device comprising: a EM input; a first EM splitter in communication with the EM input; a first circuit wherein the first circuit is in communication with the first EM splitter; a first EM combiner, wherein the first EM combiner is in communication with the first circuit; a EM output, wherein the EM output is in communication with the first EM combiner; and at least three parallel and overlying levels comprising a first level that is adjacent to a second level that is adjacent to a third level; wherein at least one of the first EM splitter, the first EM combiner, and the first circuit is located on the first level, and at least one of the first EM splitter, the first EM combiner, and the first circuit is located on the second level, and least one of the first EM splitter, the first EM combiner, and the first circuit is located on the third level.

In yet other exemplary embodiments, the first circuit and first EM combiner are located on the first level and the first EM splitter is located on the second level. Alternatively, the first circuit is a monolithic microwave integrated circuit. Alternatively, the device further comprises a fourth level that comprises a second EM splitter and a fifth level that comprises a second circuit and second EM combiner. Alternatively, one of the at least three parallel and overlying layers is connected to another of the at least three parallel and overlying layers by a waveguide transition. Alternatively, the system further comprises an impedance matching interface connected to the first circuit. Alternatively, the first level, the second level, and the third level are attached together to form an assembly.

In yet other exemplary embodiments, the present invention comprises an electric system comprising: a first RF assembly; a second RF assembly; a waveguide transition in communication with the first RF assembly and the second RF assembly; and wherein the first RF assembly and the second RF assembly are separate components connected together in a parallel relationship to one another and in separate planes.

In yet other exemplary embodiments, the first RF assembly further comprises an integrated circuit. Alternatively, the first RF assembly further comprises an input end and an output end. Alternatively, the first RF assembly is connected to the second RF assembly by a waveguide transition. Alternatively, the first RF assembly further comprises a monolithic microwave integrated circuit.

While the principles of the invention have now been made clear in illustrative embodiments, there will be immediately obvious to those skilled in the art many modifications of structure, arrangements, proportions, the elements, materials and components, used in the practice of the invention which are particularly adapted for a specific environment and operating requirements without departing from those principles. These and other changes or modifications are intended to be included within the scope of the present invention, as expressed in the following claims.

The invention claimed is:

1. A power amplifier device comprising:
an EM input;
an EM splitter in communication with the EM input;
at least two circuits, wherein the at least two circuits are in communication with the EM splitter;
an EM combiner, wherein the EM combiner is in communication with the at least two circuits;
an EM output, wherein the EM output is in communication with the EM combiner; and
at least two parallel and overlying levels comprising a first level adjacent to a second level, wherein the EM input and the EM output are located on the second level and wherein at least one of the EM splitter, the EM combiner, and the at least two circuits is located on the first level, and at least one of the EM splitter, the EM combiner, and the at least two circuits is located on the second level.

2. The power amplifier device according to claim 1, wherein the at least two circuits each comprise a monolithic microwave integrated circuit.

3. The power amplifier device according to claim 1, wherein the at least two circuits are located on the first level and wherein the EM combiner is located on the second level.

4. The power amplifier device according to claim 1, further comprising at least two impedance matching interfaces connected to the at least two circuits.

5. The power amplifier device according to claim 1, wherein the first level and the second level are attached together to form an assembly.

6. The power amplifier device according to claim 1, further comprising a waveguide transition wherein the waveguide transition is in communication with the first level and the second level.

7. The power amplifier device of claim 1, further comprising a channel that defines the EM splitter and the EM combiner.

8. The power amplifier device of claim 7, wherein the channel is a waveguide.

9. The power amplifier device of claim 1, further comprising a third level adjacent to the second level and a fourth level adjacent to the third level wherein the fourth level is in a parallel relationship and in a separate plane with the first level, the second level, and the third level.

* * * * *